(12) United States Patent
Kalnitsky et al.

(10) Patent No.: US 10,510,804 B2
(45) Date of Patent: Dec. 17, 2019

(54) SEMICONDUCTOR STRUCTURE INTEGRATED WITH MAGNETIC TUNNELING JUNCTION AND MANUFACTURING METHOD THEREOF

(71) Applicant: TAIWAN SEMICONDUCTOR MANUFACTURING COMPANY LTD., Hsinchu (TW)

(72) Inventors: Alexander Kalnitsky, San Francisco, CA (US); Harry-Hak-Lay Chuang, Hsinchu County (TW); Sheng-Haung Huang, Hsinchu (TW); Tien-Wei Chiang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/120,990

(22) Filed: Sep. 4, 2018

(65) Prior Publication Data

US 2018/0374896 A1 Dec. 27, 2018

Related U.S. Application Data

(62) Division of application No. 14/871,685, filed on Sep. 30, 2015, now Pat. No. 10,068,945.

(51) Int. Cl.
*H01L 27/22* (2006.01)
*H01L 43/12* (2006.01)

(52) U.S. Cl.
CPC ............ *H01L 27/228* (2013.01); *H01L 43/12* (2013.01)

(58) Field of Classification Search
CPC .................................. H01L 27/226; H01L 27/228
See application file for complete search history.

(56) References Cited

U.S. PATENT DOCUMENTS 7,582,890 B2 9/2009 Ha et al.
8,724,377 B2 5/2014 Yamanaka et al.
(Continued)

FOREIGN PATENT DOCUMENTS

CN 1734662 A 2/2006
CN 101777569 A 7/2010
(Continued)

OTHER PUBLICATIONS

Office Action and Search Report dated Feb. 20, 2019 from the Korean Intellectual Property Office for counterpart application 10-2018-0073442.

(Continued)

*Primary Examiner* — Amar Movva
(74) *Attorney, Agent, or Firm* — WPAT, P.C., Intellectual Property Attorneys; Anthony King

(57) ABSTRACT

The present disclosure provides a semiconductor structure including a substrate, a transistor region having a gate over the substrate and a doped region at least partially in the substrate, a first metal layer over the transistor region, and a magnetic tunneling junction (MTJ) between the transistor region and the first metal layer. The present disclosure provides a method for manufacturing a semiconductor structure, including forming a transistor region over a substrate, the transistor region comprising a gate and a doped region, forming a magnetic tunneling junction (MTJ) over the transistor region, electrically coupling to the transistor region, and forming a first metal layer over the MTJ, electrically coupling to the MTJ and the transistor region.

20 Claims, 26 Drawing Sheets

(56) References Cited

U.S. PATENT DOCUMENTS

| | | | |
|---|---|---|---|
| 2006/0098473 | A1 | 5/2006 | Yasuda |
| 2006/0276034 | A1* | 12/2006 | Blanchard ......... H01L 21/76802 |
| | | | 438/672 |
| 2011/0266600 | A1 | 11/2011 | Kanaya et al. |
| 2013/0058161 | A1* | 3/2013 | Yamanaka .............. H01L 43/08 |
| | | | 365/173 |
| 2014/0078808 | A1* | 3/2014 | Hashim .............. G11C 13/0007 |
| | | | 365/148 |

FOREIGN PATENT DOCUMENTS

| | | |
|---|---|---|
| CN | 102983272 A | 3/2013 |
| KR | 20060052550 | 5/2006 |

OTHER PUBLICATIONS

US Patent Publication 20060098473 is the translation to Foreign Document No. KR20060052550.
Office Action and Search Report dated Mar. 18, 2019 by Chinese National Intellectual Property Office (CNIPA) for counterpart application No. 201610861304.6.
English Abstract Translation of Foreign Patent Document CN101777569A.
Foreign Patent Document CN1734662A is a family patent to U.S. Pat. No. 7,582,890B2.
Foreign Patent Document CN102983272A is a family patent to U.S. Pat. No. 8,724,377B2.

\* cited by examiner

SEMICONDUCTOR STRUCTURE INTEGRATED WITH MAGNETIC TUNNELING JUNCTION AND MANUFACTURING METHOD THEREOF

CROSS REFERENCE TO RELATED APPLICATION

This application is a divisional application to U.S. non-provisional application Ser. No. 14/871,685, filed Sep. 30, 2015, and claims priority thereto.

FIELD

The present disclosure relates to a semiconductor structure integrated with a magnetic tunneling junction and method of manufacturing the semiconductor structure integrated with the magnetic tunneling junction.

BACKGROUND

With increasing use of portable computing devices and wireless communication devices, memory devices may require higher density, lower power, and/or nonvolatile properties. Magnetic memory devices may be able to satisfy the aforementioned technical requirements.

An example data storing mechanism for a magnetic memory device is a tunnel magneto resistance (TMR) effect of a magnetic tunnel junction (MTJ). For example, a magnetic memory device with a MTJ have been developed such that an MTJ may have a TMR ratio of several hundred to several thousand percent.

A magnetoresistive random access memory (MRAM) cell is formed by a magnetic tunneling junction (MTJ), which is a structure in which two ferromagnetic layers are separated by a thin insulating barrier. When a potential difference is applied across the two ferromagnetic layers, current flows through the insulating barrier by quantum mechanical tunneling. The resistance of the MTJ depends on the relative orientation of magnetic elements in the two ferromagnetic layers. The resistance is lowest when the magnetizations are aligned in parallel and highest when they are anti-parallel. One of the relative orientations can be used to represent a "1" and the other to represent a "0". In general, the magnetic orientation of one of the layers (the pinned layer) is kept fixed while the magnetic orientation of the other layer (the free layer) is set in a write operation. The state of the MRAM cell can be queried by measuring the junction's resistance. For an array of MRAM cells to provide reliable data storage, a sufficiently great difference in resistance between the two possible states must be realized for each cell in the array.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
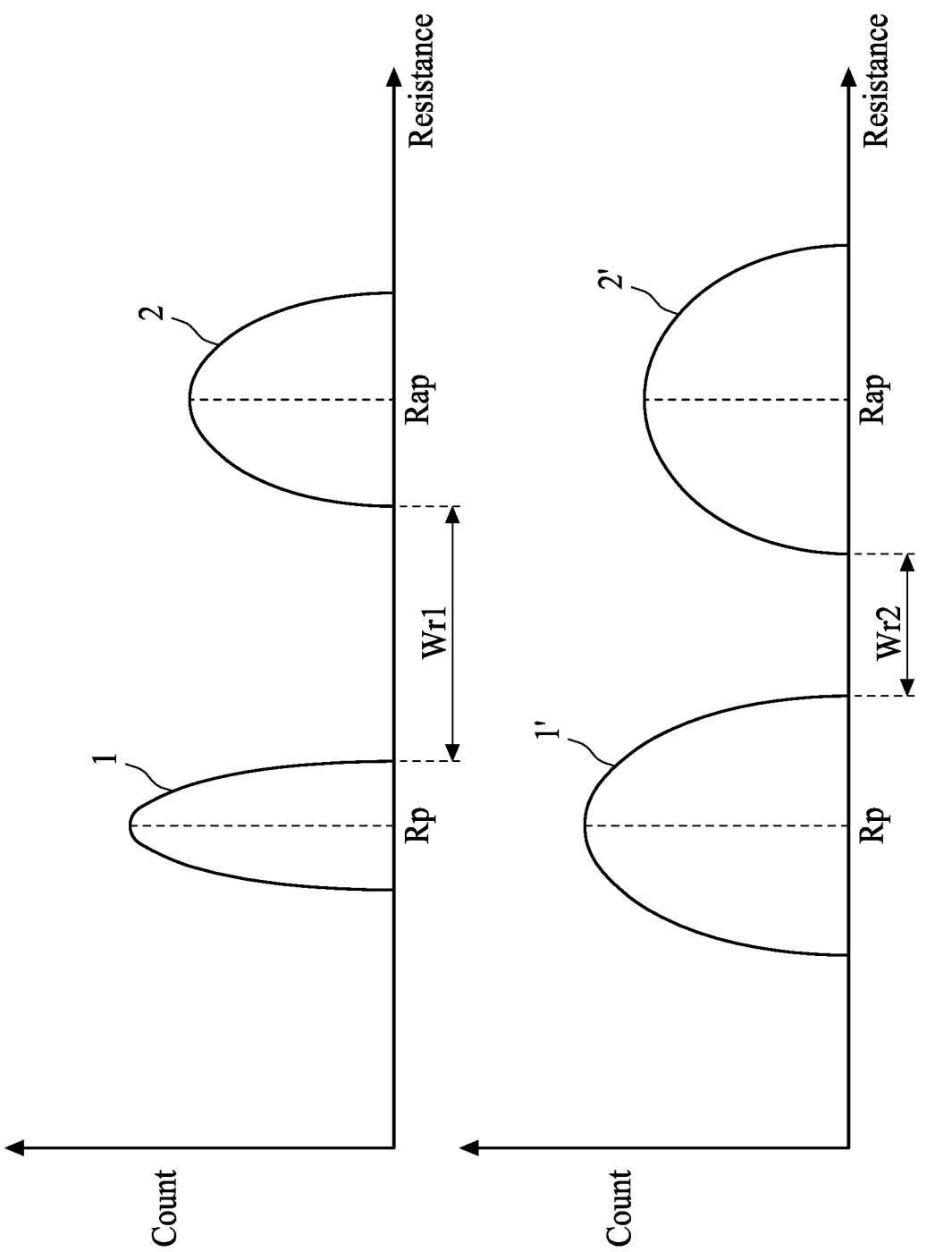
FIG. 1 is a diagram illustrating a read window of a semiconductor structure integrated with an MTJ, according to some embodiments of the present disclosure.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described is otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

In the drawings, like reference numbers are used to designate like or similar elements throughout the various views and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Enlarging a read window in an MRAM cell can be achieved by obtaining a narrower full-width-half-maxima (FWHM) of the device count peak with respect to the resistance level. Referring to FIG. 1, FIG. 1 is a diagram illustrating a read window of a semiconductor structure integrated with an MTJ, according to some embodiments of the present disclosure. An upper diagram and lower diagram of FIG. 1 show an X axis of resistance and a Y axis of counts of number of devices tested. The upper diagram of FIG. 1 illustrates an ideal case where only device signal is accounted and rendering a narrow FWHM on both the Gaussian peak 1 and Gaussian peak 2. In some embodiments, the Gaussian peak 1 refers to a "low" logic level ($R_{low}$) while the Gaussian peak 2 refers to a "high" logic level ($R_{high}$).

Similarly, The lower diagram of FIG. 1 illustrates a real case where not only device signal but also a summation of signal from routing metal are accounted and rendering a broadened FWHM on both the Gaussian peak 1' and Gaussian peak 2'. In some embodiments, the Gaussian peak 1' refers to a "low" logic level ($R_{low}$) while the Gaussian peak 2' refers to a "high" logic level ($R_{high}$).

A read window referred herein is a range of a specific resistance arbitrarily chosen between the "low" logic level ($R_{low}$) and the "high" logic level ($R_{high}$). Comparing the read window of the upper diagram and the lower diagram of FIG. 1, the read window Wr1 of the upper diagram is substantially wider than the read window Wr2 of the lower diagram. In some embodiments, the lower diagram of FIG. 1 is derived from a real semiconductor device where an MRAM cell is positioned between two sequential metal layers $M_x$ and $M_{x+1}$. In some embodiments, the MRAM cell is formed after the fourth metal layer $M_4$ and before the fifth metal layer $M_5$. The metal layer referred herein can be directed to horizontal metallic connection within dielectric materials, as opposed to vertical metallic connection, or so-called "via". In such condition, the signal of the MRAM cell inevitably include all the information from previous metal interconnects $M_1$, $M_2$, $M_3$, including metal lines at different levels and all the vias connecting the aforesaid metal lines.

The information contributed from the aforesaid previous metal layers, the MRAM cell, and the underlying transistor can be different from device to device. For example, process variation may cause the thicknesses or the lengths of different metal layer or vias to form a finite distribution. In other words, undergoing identical manufacturing operations, device A and device B may demonstrate different "low" logic level ($R_{low}$) and the different "high" logic level ($R_{high}$). When taking all the devices fabricated into account, FWHM of the "low" logic level ($R_{low}$) and the "high" logic level ($R_{high}$) are broadened as shown in the lower diagram of FIG. 1, deviated from narrow counterpart of the ideal case shown in the upper diagram of FIG. 1.

Pursuing a narrower read window of a memory device is one intended purpose of the present disclosure.

The process variation can be magnified if the manufacturing variation at lower metal layer is further carried to the upper metal layer. For example, chemical mechanical polishing (CMP) is an operation for Damascene metal structure. When a CMP operation in the lower metal layer does not provide a planarized surface, the small height variation is magnified when reaching the upper metal layer, causing a more serious height variation. It is understood that structural variation of metal layers can directly influence series resistance of the metal layers. When all the devices fabricated are taken into account, series resistance of the metal layers can also form a distribution, broadening the FWHM of the peaks of the "low" logic level ($R_{low}$) and that of the "high" logic level ($R_{high}$).

To narrow the FWHM of the $R_{low}$ and $R_{high}$ peaks, the present disclosure provides a memory cell formed before all the metal layer above a transistor region. For example, an MRAM cell can be formed before the first metal interconnect $M_1$. Alternatively stated, the MRAM cell described herein is formed during the middle-end-of-line (MEOL) operation and before the back-end-of-line (BEOL) operation. In some embodiments, the MEOL operation refers to all the operation after the formation of the gate and source/drain of a transistor and before the formation of any metal layers, or Cu-process. Particular MEOL operation includes the formation of conductive plug structure from the gate or source/drain region, and the formation of dielectric layer encapsulating the transistor structure. Particular BEOL operation includes all the operations after the formation of the metal layer, or the Cu-process.

Forming an MRAM cell before metal layers minimizes the signal from metal routings and thus a narrower FWHM of the $R_{low}$ and $R_{high}$ peaks can be obtained. Furthermore, the subsequent processing window for CMP operations in the BEOL can be widened due to the fact that the contribution of process variation in BEOL generates a smaller impact to the read window as far as a memory device is concerned.

Figure 2:
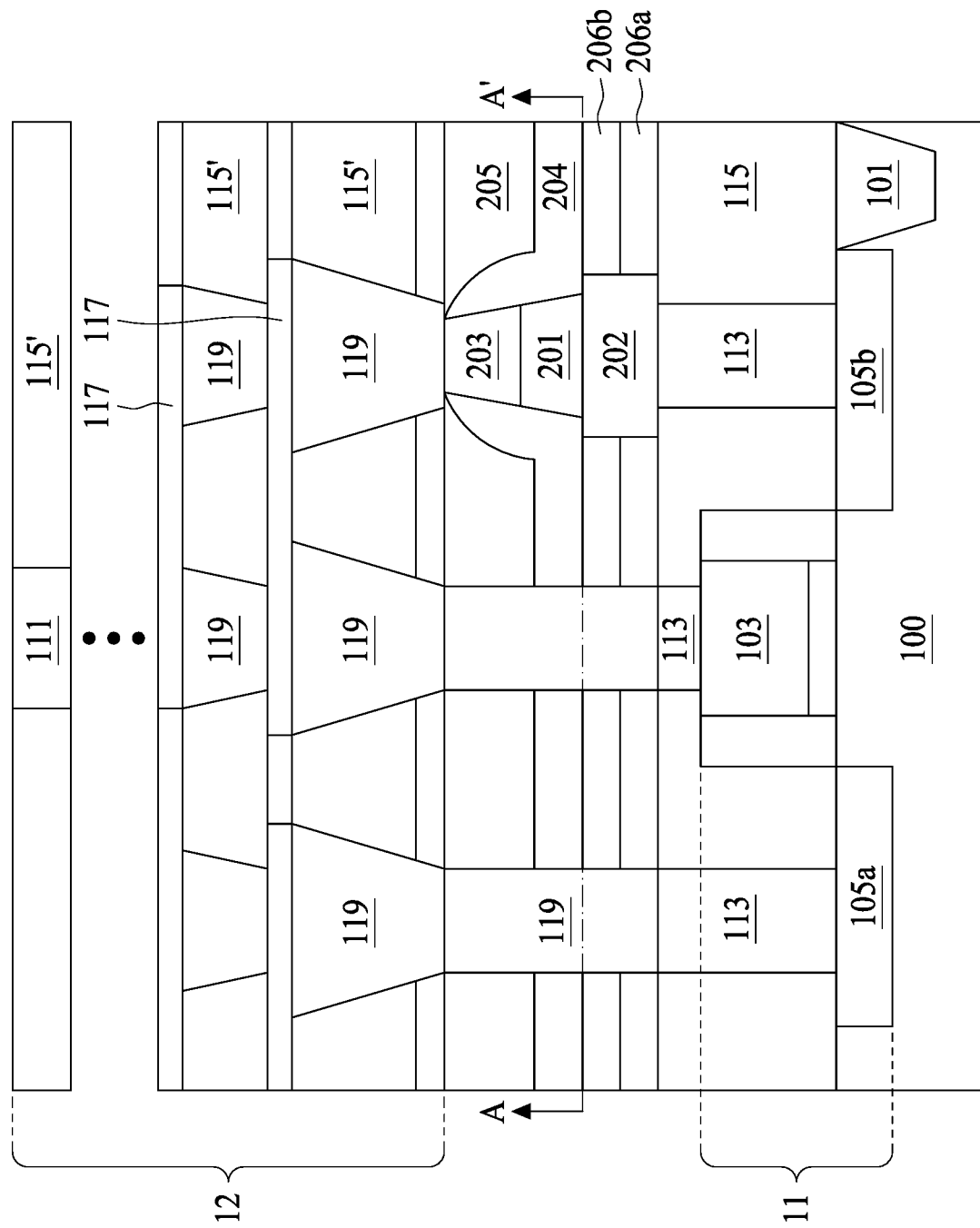
FIG. 2 is a cross section of a semiconductor structure integrated with an MTJ, according to some embodiments of the present disclosure.

Referring to FIG. 2, FIG. 2 is a cross section of a semiconductor structure 10 integrated with an MTJ, according to some embodiments of the present disclosure. In FIG. 2, transistor region 11, which are symbolized using a transistor, may be formed at a surface of substrate 100. In alternative embodiments, substrate 100 is a dielectric substrate, and no active devices are formed on the dielectric substrate, although passive devices such as capacitors, inductors, resistors, and the like may be formed. Contact plugs 113 are formed in inter-layer dielectric (ILD) 115, and may be electrically coupled to transistor region 11. The semiconductor device 11 and the contact plugs 113 can be collectively referred to as a transistor region. The semiconductor device 11 includes a gate 103 and doped regions 105a, 105b at least partially in the substrate 100. FIG. 2 shows a planar transistor having a doped region in the substrate 100. However, the present disclosure is not limited thereto. Any non-planar transistor, such as a FinFET structure, can have raised doped regions 105a, 105b.

Interconnect structure 12, which includes metal lines 117 and vias 119 therein and electrically coupling to transistor region 11, is formed over ILD 115. Metal lines 117 and vias 119 may be formed of substantially pure copper (for example, with a weight percentage of copper being greater than about 90 percent, or greater than about 95 percent) or copper alloys, and may be formed using the single and/or dual damascene processes. Metal lines 117 and vias 119 may be, or may not be, substantially free from aluminum. Interconnect structure 12 includes a plurality of metal interconnects, namely $M_1$, $M_2$ . . . $M_{top}$ 111, wherein metal interconnect $M_1$ is the metal lines and vias closest to the ILD 115, while metal interconnect $M_{top}$ 111 is the top metal lines and vias that are farthest to the ILD 115. Throughout the description, the term "metal interconnects" refers to the collection of the metal lines and vias in the same layer. Metal interconnects $M_1$ through $M_{top}$ 111 are formed in inter-metal dielectrics (IMDs) 115', which may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 115' may also be close to 3.8. In some embodiments, the k values of the low-k dielectric materials are lower than about 3.0, and may be lower than about 2.5.

In FIG. 2, the semiconductor substrate 100 may be but is not limited to, for example, a silicon substrate. In an embodiment, substrate 100 is a semiconductor substrate, such as a silicon substrate, although it may include other semiconductor materials, such as silicon germanium, silicon carbide, gallium arsenide, or the like. In the present embodiment, the substrate 100 is a p-type semiconductor substrate (P-Substrate) or an n-type semiconductor substrate (N-Substrate) comprising silicon. Alternatively, the substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 100 is a semiconductor on insulator (SOI). In other alternatives, semiconductor substrate 100 may include a doped epi layer, a gradient semiconductor layer, and/or a semiconductor layer overlying another semiconductor layer of a different type, such as a silicon layer on a silicon germanium layer. The substrate 100 may or may not include doped regions, such as a p-well, an n-well, or combination thereof.

A number of shallow trench isolation (STI) regions 101 are formed in the semiconductor substrate 100. The STI regions 101, which may be formed of suitable dielectric materials, may be provided to isolate a transistor electrically from neighboring semiconductor devices such as other transistors. The STI regions 101 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The STI regions may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the STI regions may also be formed of any suitable "low dielectric constant" or "low K" dielectric material, where K is less than or equal to about 4.

Still in FIG. 2, the ILD 115 or IMD 115' may be formed by a variety of techniques for forming such layers, e.g., chemical vapor deposition (CVD), low-pressure CVD (LP-CVD), plasma-enhanced CVD (PECVD), sputtering and physical vapor deposition (PVD), thermal growing, and the like. The dielectric layer above the semiconductor substrate 100 may have a thickness ranging up to approximately 50 Angstrom, for example, and may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

Still referring to FIG. 2, metal interconnects $M_1$, $M_2$, and $M_{top}$ include conductive material in IMDs 115'. The conductive material can by Ta, Cu, Al, or and other suitable metal. The IMD 115' can include one or more layers of any suitable dielectric(s). The dielectric can be $SiO_2$. In some embodiments, the dielectric is a low-k dielectrics. A low-k dielectric is a material having a dielectric constant lower than that of silicon dioxide. Examples of low-k dielectrics include organosilicate glasses (OSG) such as carbon-doped silicon dioxide, fluorine-doped silicon dioxide (otherwise referred to as fluorinated silica glass (or FSG), and organic polymer low-k dielectrics. Examples of organic polymer low-k dielectrics include polyarylene ether, polyimide (PI), benzocyclobutene, and amorphous polytetrafluoroethylene (PTFE). A low-k dielectric can be applied by any suitable means, including for example, spin coating or CVD.

A memory structure, for example, an MRAM cell, is positioned between the semiconductor device 11 and the interconnect structure 12. In some embodiments, an MTJ layer 201 consisting of multiple ferromagnetic and non-ferromagnetic layers, having a lower electrode 202 and a upper electrode 203 parallel with the multiple layers. For example, the lower electrode 202 can be made in contact with the contact plug 113 extending from the semiconductor device 11. The upper electrode 203 can be made in contact with a via 119 of the first metal interconnect $M_1$. Note the first metal interconnect $M_1$ includes via 119 and metal lines 117 closest to the ILD 115. The upper electrode 203 is under the first metal interconnect $M_1$, specifically, the upper electrode 203 is under a via 119 of the first metal interconnect $M_1$. Furthermore, a protection layer 204 covering at least a sidewall of the MTJ layer 201 is positioned over dielectric layers 206a, 206b. The protection layer 204 is configured to prevent the sidewall of the MTJ layer 201 from oxidation or from other contamination in the subsequent processing. The structural integrity of the MTJ layer 201 is crucial to the performance of the memory. In some embodiments, the dielectric layers 206a, 206b can be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. Moreover, another dielectric layer 205 can be formed over the protection layer 204 and being level with the upper electrode 203 of the MRAM cell.

Figure 3:
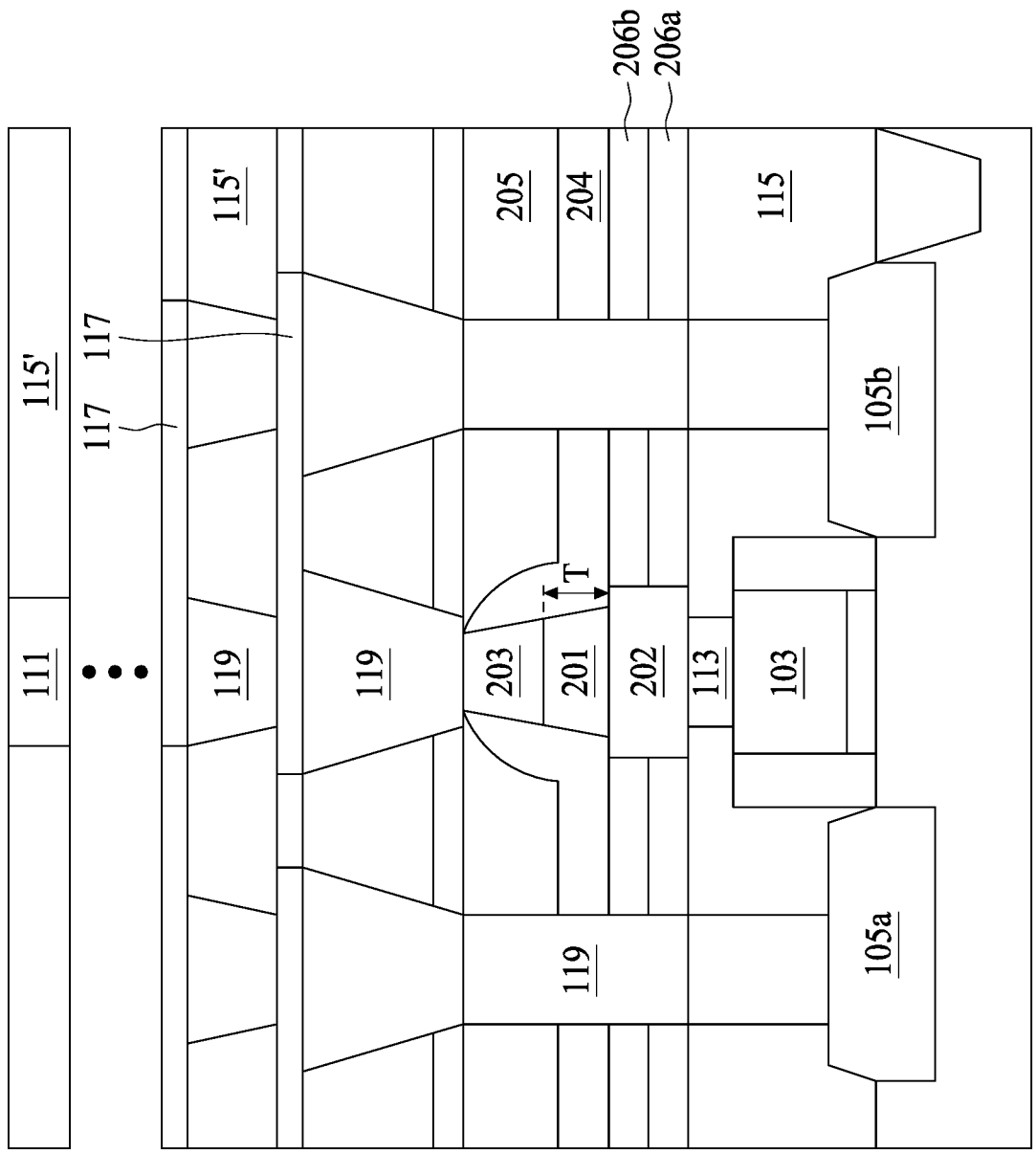
FIG. 3 is a cross section of a semiconductor structure integrated with an MTJ, according to some embodiments of the present disclosure.

Referring to both FIG. 2 and FIG. 3, FIG. 3 is a cross section of a semiconductor structure integrated with an MTJ, according to some embodiments of the present disclosure. In FIG. 2, the lower electrode 202 of the MRAM cell is electrically coupled with the doped region 105b. In some embodiments, the doped region 105b is a drain or a source. In FIG. 3, the lower electrode 202 of the MRAM cell is electrically coupled with the gate 103. In some embodiments, the gate 103 of the semiconductor device 11 can be a polysilicon gate or a metal gate. As shown in FIG. 3, a height T of the MTJ layer 201 is in a range of from about 150 Å to about 250 Å. Such height T is suitable for integrating an MTJ layer 201 into the MEOL operation, between the interconnect structure 12 and the transistor region.

In FIG. 2 and FIG. 3, the MRAM cell is disposed in the semiconductor structure 10 in such a way that the first metal interconnect $M_1$, the gate 103, the doped regions 105a, 105b, and the MTJ layer 201 form a conductive loop. In other words, no matter the MRAM cell is positioned above the doped regions 105a, 105b, or above the gate 103, the "low" logic level ($R_{low}$) and the "high" logic level ($R_{high}$) can be determined when a current travelling the aforesaid conductive loop. In this connection, conductive signal may no longer contain information from upper metal layers $M_x$ (x>1) and narrow down the read window of the MRAM cell.

Figure 4:
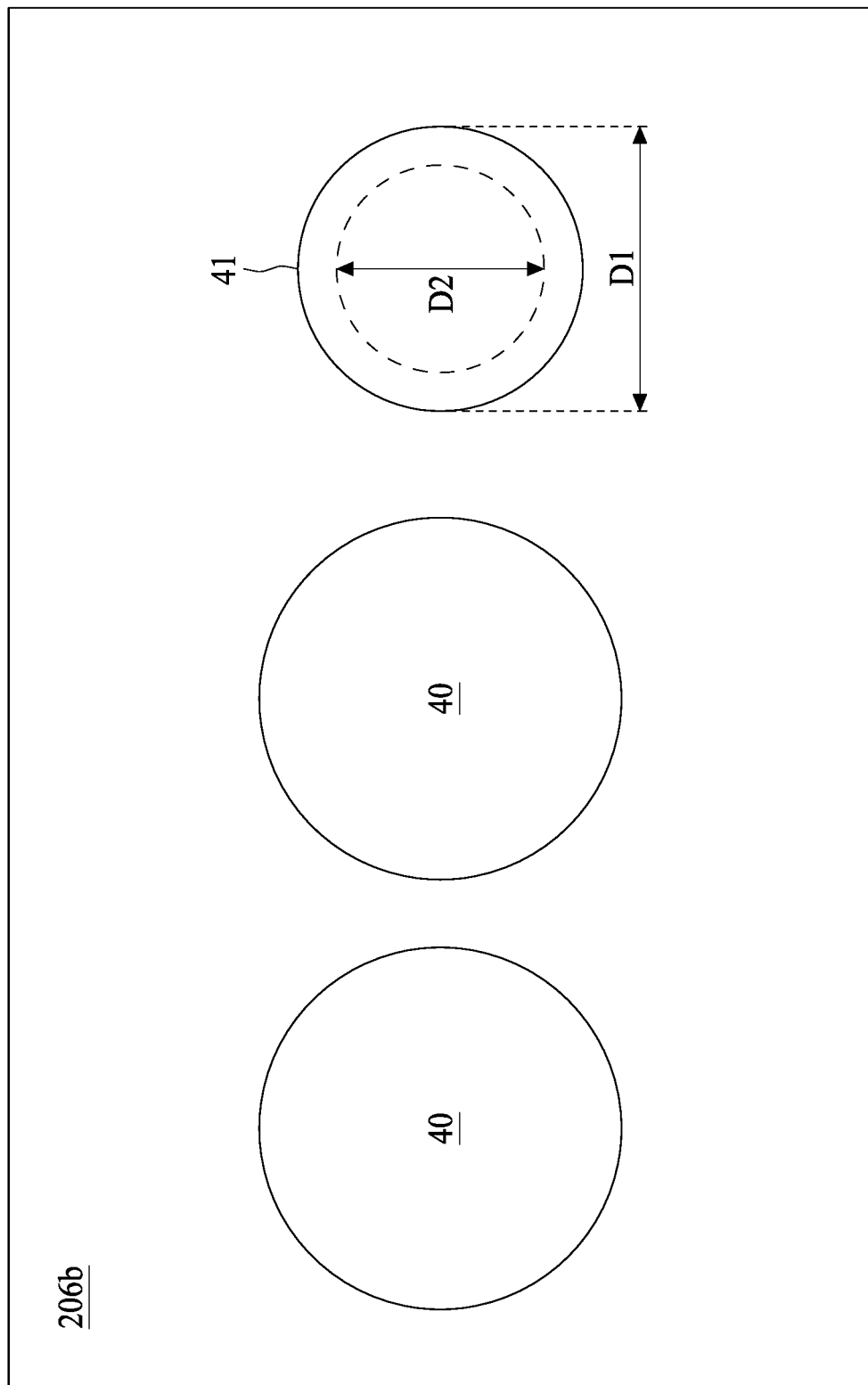
FIG. 4 is a top view of one layer of a semiconductor structure integrated with an MTJ, according to some embodiments of the present disclosure.

Referring to FIG. 4, FIG. 4 is a top view of one layer of a semiconductor structure integrated with an MTJ, according to some embodiments of the present disclosure. In some embodiments, FIG. 4 is a top view dissecting along line AA' of FIG. 2. From a top view perspective, vias 119 of the first metal interconnect M₁ have a foot print of, for example, two circles 40. However, the foot print of the vias 119 of the first metal interconnect M₁ may not be limited thereto. Other geometrical shapes are within the contemplated scope of the present disclosure. On the surface of the dielectric layer 206b, the MTJ layer 201 has a foot print of, for example, a circle 41. A bottom of the MTJ layer 201 may possess a diameter D1, and a top of the MTJ layer 201 may possess a diameter D2 shown in dotted lines. In some embodiments, the diameter D1 of the MTJ layer 201 is in a range of from about 10 nm to about 60 nm. In some embodiments, the diameter D2 of the MTJ layer 201 is smaller than the diameter D1 by 20% to 50%.

Figure 5:
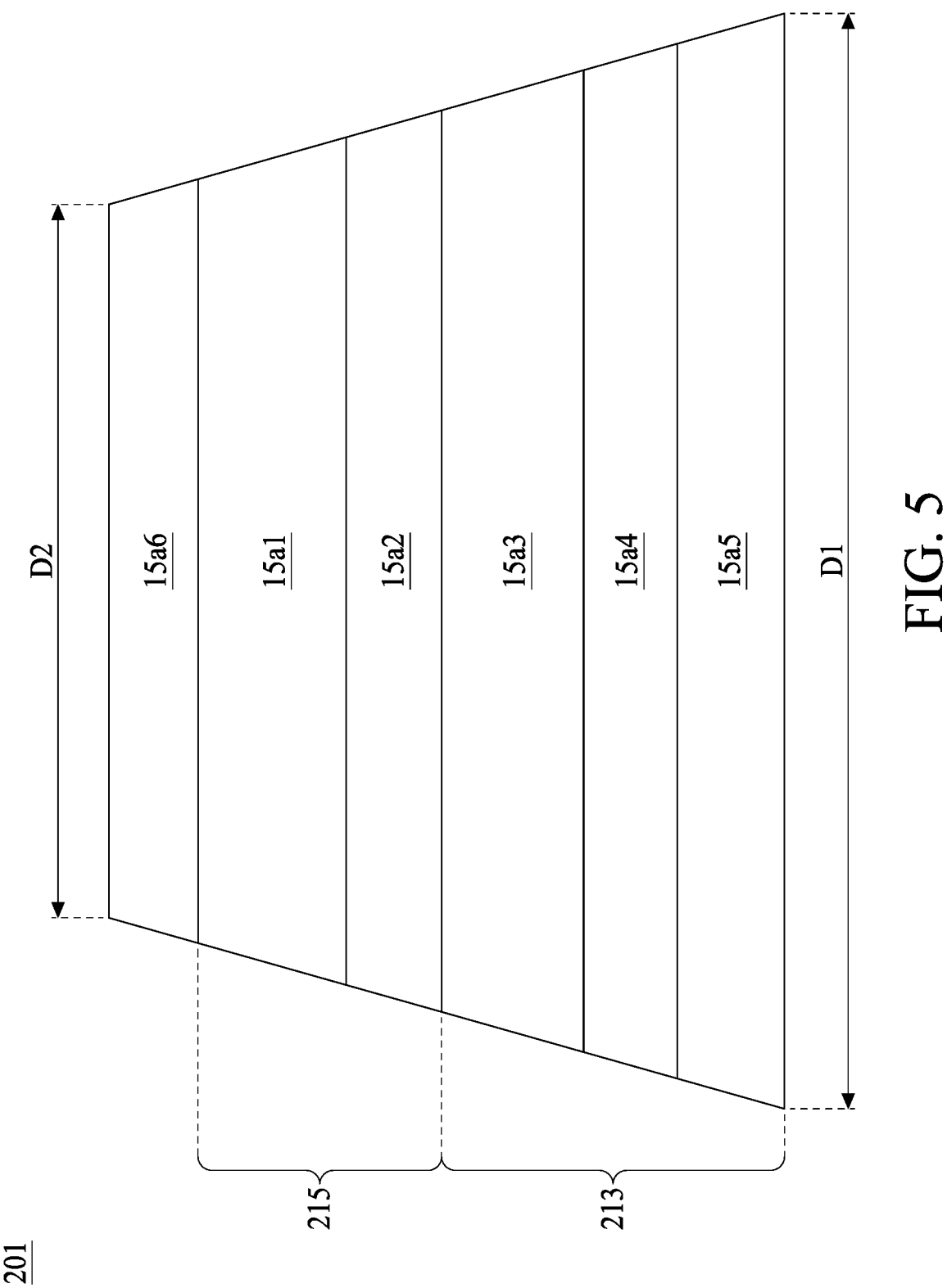
FIG. 5 is a diagram illustrating layers constituting an MTJ, according to some embodiments of the present disclosure.

FIG. 5 is a diagram illustrating multiple ferromagnetic and non-ferromagnetic layers constituting an MTJ layer 201, according to some embodiments of the present disclosure. Referring to FIG. 5, the MTJ layer 201 may include ferromagnetic layers 15a1, 15a3 and 15a5, spacers 15a2 and 15a4, and a capping layer 15a6. The spacer 15a2 is formed on the ferromagnetic layer 15a1. The ferromagnetic layer 15a1 is formed on the spacer 15a2. The spacer 15a2 is formed on the ferromagnetic layer 15a3. The ferromagnetic layer 15a3 is formed on the spacer 15a4. The capping layer 15a6 is formed on the ferromagnetic layer 15a1. Each of the ferromagnetic layers 15a1, 15a3 and 15a5 may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacer 15a2 may include non-ferromagnetic metal, for example, Ag, Au, Cu, Ta, W, Mn, Pt, Pd, V, Cr, Nb, Mo, Tc, Ru or the like. The spacer 15a4 may include insulator, for example, $Al_2O_3$, MgO, TaO, RuO or the like. The capping layer 15a6 may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer 15a6 may reduce write current of its associated magnetic random access memory (MRAM) cell. In some embodiments, spacer 15a4 and capping layer 15a6 can be any suitable dielectrics materials. Dielectric materials that can be suitable for these layers include, for example, SiN, $SiO_X$, and SiON. In some embodiments, spacer 15a4 is formed from one or more materials selected from the group consisting of SiN, $SiO_X$, and SiON.

The ferromagnetic layer 15a1 may function as a free layer 215 whose magnetic polarity or magnetic orientation can be changed during write operation of its associated MRAM cell. The ferromagnetic layers 15a3, 15a5 and the spacer 15a4 may function as a fixed or pinned layer 213 whose magnetic orientation may not be changed during operation of its associated MRAM cell. It is contemplated that the MTJ layer 201 may include an antiferromagnetic layer (not shown in FIG. 5) in accordance with other embodiments. In some embodiments, the pinned layer 213 is closer to the lower electrode 202 and thus the doped region 105b than the free layer 215. Free layer 215 and pinned layer 213 can be any suitable ferromagnetic or other material that performs similarly to a ferromagnetic material. Materials that can be suitable include NiFe, CoFe, CoFeB. In some embodiments, free layer 215 includes CoFeB. In some embodiments, the pinned layer 213 includes either CoFe or COFeB.

In FIG. 5, an upper surface of the MTJ layer 201 possesses a diameter D2, whereas a bottom surface of the MTJ layer 201 possesses a diameter D1. With reference to FIG. 4, the diameter D1 is greater than the diameter D2. The ferromagnetic layer 15a5 is in contact with the lower electrode 202, and the capping layer 15a6 is in contact with the upper electrode 203.

Figure 6:
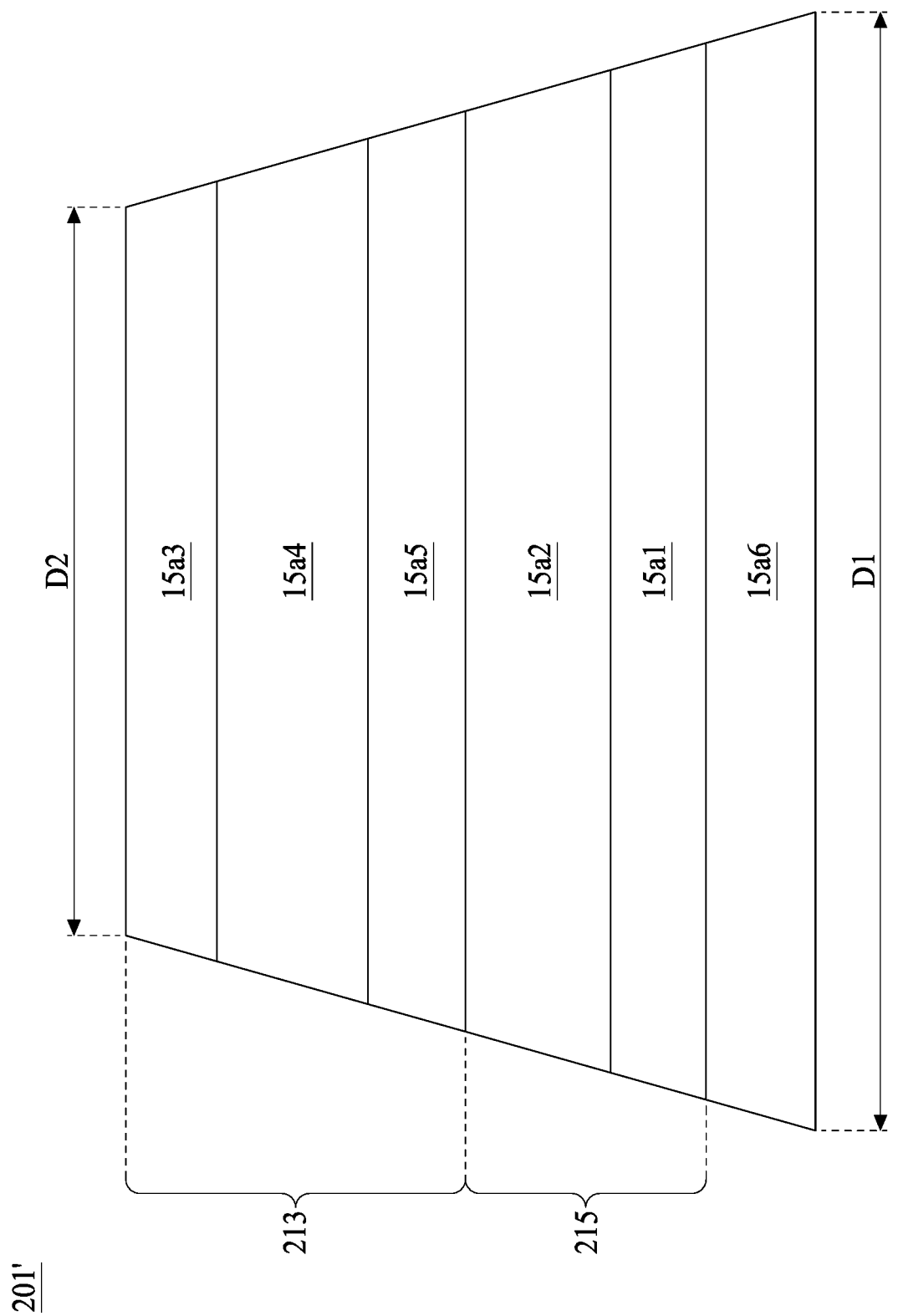
FIG. 6 is a diagram illustrating layers constituting an MTJ, according to some embodiments of the present disclosure.

FIG. 6 is a diagram illustrating layers constituting an MTJ, according to some embodiments of the present disclosure. FIG. 6 is a diagram illustrating multiple ferromagnetic and non-ferromagnetic layers constituting an MTJ layer 201', according to some embodiments of the present disclosure. Referring to FIG. 6, the MTJ layer 201' may include ferromagnetic layers 15a1, 15a3 and 15a5, spacers 15a2 and 15a4, and a capping layer 15a6. The spacer 15a2 is formed on the ferromagnetic layer 15a1. The ferromagnetic layer 15a3 is formed on the spacer 15a4. The spacer 15a4 is formed on the ferromagnetic layer 15a5. The ferromagnetic layer 15a5 is formed on the spacer 15a2. The ferromagnetic layer 15a1 is formed on the capping layer 15a6. The ferromagnetic layer 15a1 may function as a free layer 215 whose magnetic polarity or magnetic orientation can be changed during write operation of its associated MRAM cell. The ferromagnetic layers 15a3, 15a5 and the spacer 15a4 may function as a fixed or pinned layer 213 whose magnetic orientation may not be changed during operation of its associated MRAM cell. It is contemplated that the MTJ layer 201 may include an antiferromagnetic layer (not shown in FIG. 5) in accordance with other embodiments.

In FIG. 6, an upper surface of the MTJ layer 201 possesses a diameter D2, whereas a bottom surface of the MTJ layer 201 possesses a diameter D1. With reference to FIG. 4, the diameter D1 is greater than the diameter D2. The capping layer 15a6 is in contact with the lower electrode 202, and the ferromagnetic layer 15a3 is in contact with the upper electrode 203. FIG. 6 is a reversed MTJ layers to that of FIG. 5. In FIG. 5, the electric current enters the ferromagnetic layer 15a5 and exits the MTJ layer 201 through the capping layer 15a6. In FIG. 6, the electric current enters the ferromagnetic layer 15a3 and exits the MTJ layer 201' through the capping layer 15a6. Depending from different current input directions, the stacking order of the MTJ layer 201, 201' can be changed accordingly. In some embodiments, the free layer 215 is closer to the lower electrode 202 and thus the doped region 105b than the pinned layer 213.

Since manufacturing an MTJ layer 201 during MEOL operation increases the chance of exposing the MTJ layer 201 under high temperature environment, especially during the subsequent metallization operations in BEOL, the MTJ layer 201 introduced herein can endure the high temperature environment without serious diffusion deteriorating memory device performance.

Figure 7:
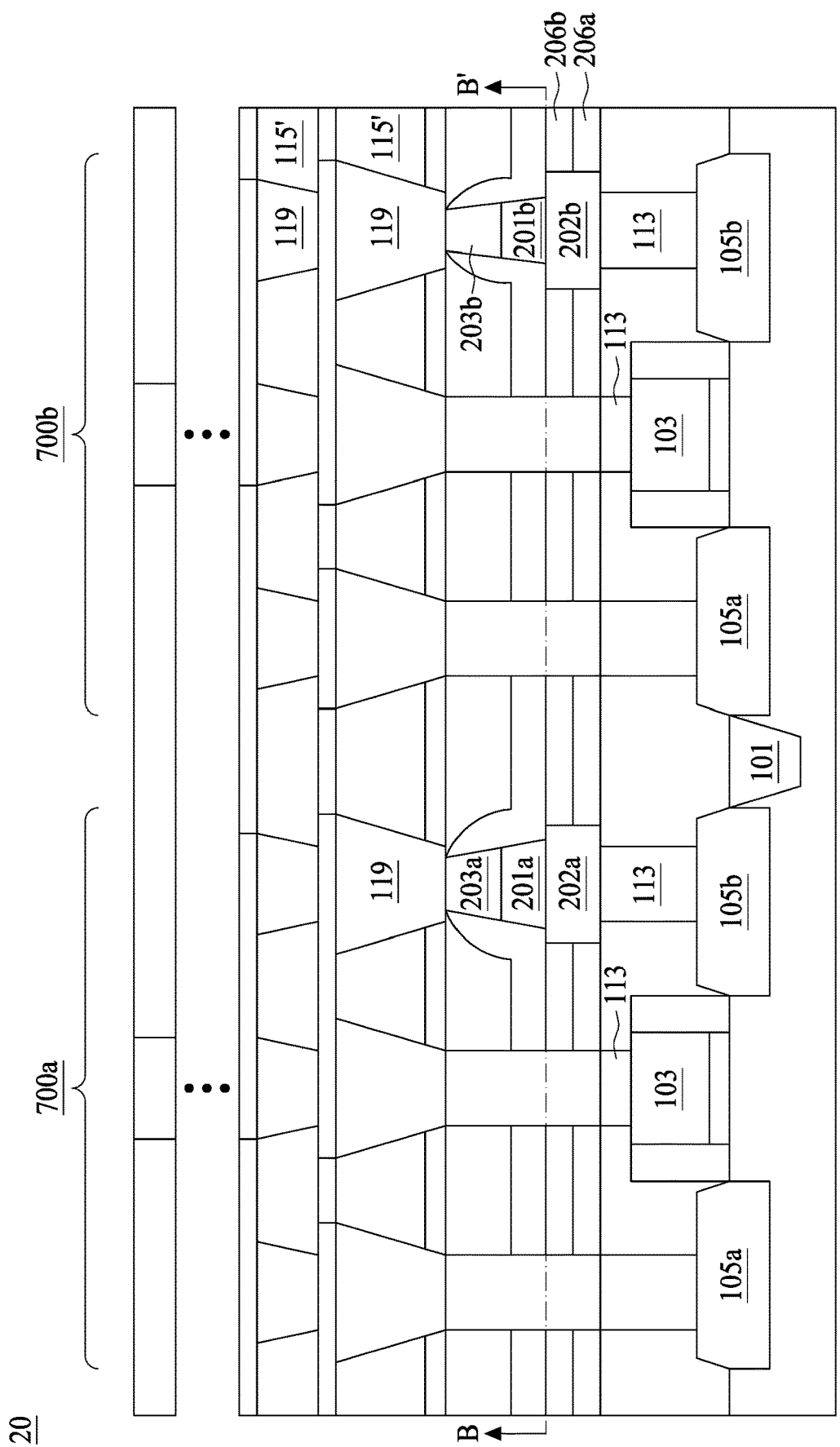
FIG. 7 is a cross section of a semiconductor structure integrated with an MTJ in a first region and a second region, according to some embodiments of the present disclosure.
Figure 8:
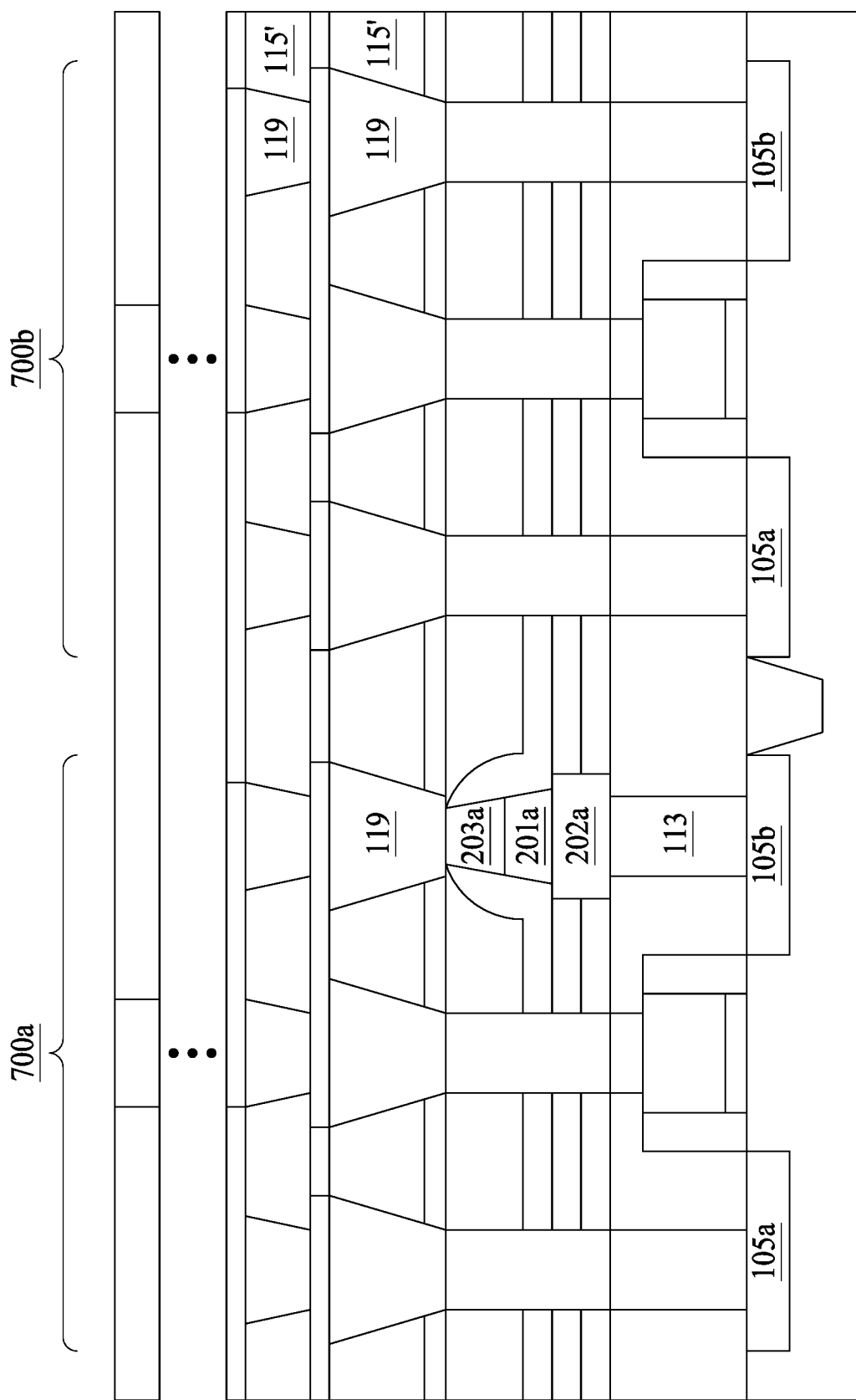
FIG. 8 is a cross section of a semiconductor structure integrated with an MTJ in a first region, according to some embodiments of the present disclosure.
Figure 9:
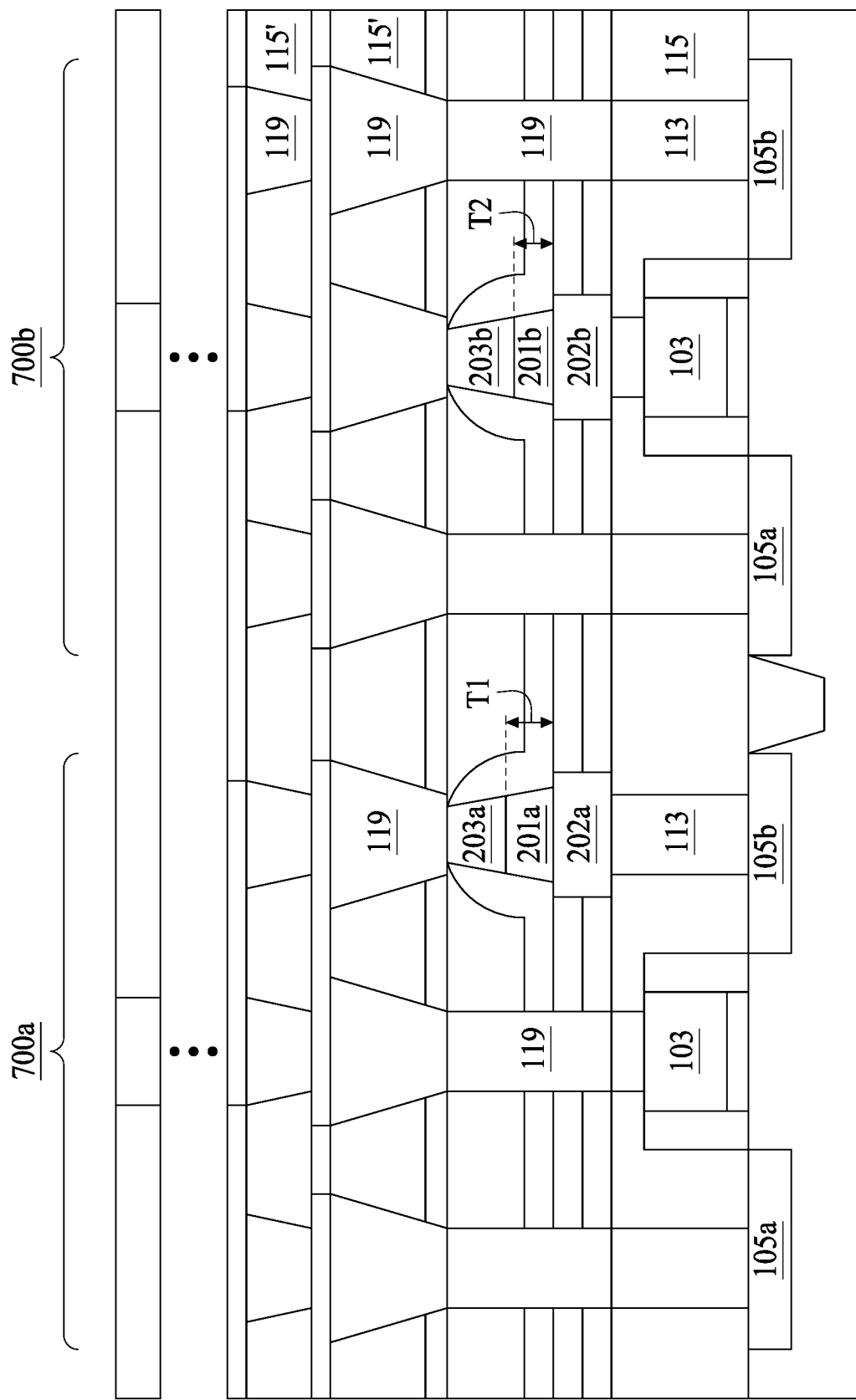
FIG. 9 is a cross section of a semiconductor structure integrated with an MTJ in a first region and a second region, according to some embodiments of the present disclosure.

FIG. 7 is a cross section of a semiconductor structure 20 integrated with an MTJ in a first region 700a and/or a second region 700b, according to some embodiments of the present disclosure. Numeral labels in FIG. 7 identical to those in FIG. 2 and FIG. 3 are referred to same elements or equivalents thereof and are not repeated here for simplicity. A first MTJ layer 201a and a second MTJ layer 201b are positioned in the first region 700a and the second region 700b, respectively. The first region 700a and the second region 700b are two portions of an integrated circuit each having at least one transistor structure and the first region 700a is not overlapping with the second region 700b. However, the first region 700a or the second region 700b each does not have to possess an MTJ simultaneously. For example, as shown in FIG. 8, a second region 700b is free of an MTJ or any other memory structure. Referring to FIG. 7 and FIG. 9, the MTJs 201a, 201b in FIG. 7 are both electrically coupled to a doped region 105b, whereas the first MTJ 201a of the first region 700a in FIG. 9 is coupled to a doped region 105b and the second MTJ 201b of the second region 700b is coupled to a gate 103.

As shown in FIG. 9, a height T1 of the first MTJ layer 202a in the first region 700a is greater than a height T2 of the second MTJ layer 202b in the second region 700b. In some embodiments, the bottom diameter D1 of the first MTJ layer 202a and the bottom diameter D1' of the second MTJ layer 202a are substantially the same, only heights of the two MTJ layers 202a, 202b are different. It is known that the amount of current sufficient to change the magnetic polarity of an MTJ is related to the total volume of the MTJ. Since the diameters D1, D1' of the first MTJ layer 202a and the second MTJ layer 202b, respectively, are substantially identical, the second MTJ layer 202b with smaller height T2 is prone to change the magnetic polarity under a same current. In some embodiments, the MTJ layer 202b can be an SRAM and the MTJ layer 202a can be a flash.

Figure 10:
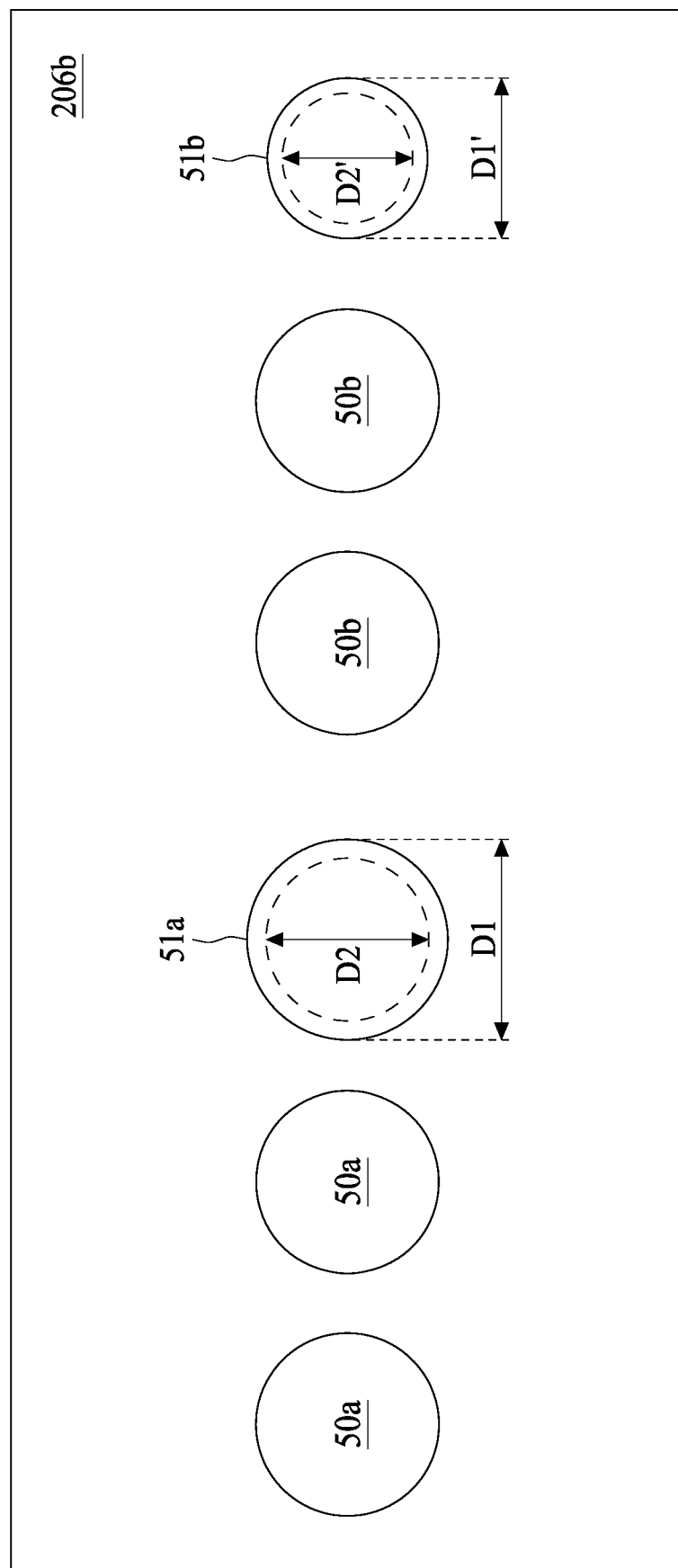
FIG. 10 is a top view of one layer of a semiconductor structure integrated with an MTJ, according to some embodiments of the present disclosure.

Referring back to FIG. 7, a diameter of the first MTJ 201a is different from that of the second MTJ 201b. As shown in FIG. 10, FIG. 10 is a top view dissecting from line BB' of a semiconductor structure 20 integrated with an MTJ in the first region 700a and the second region 700b, according to some embodiments of the present disclosure.

In FIG. 10, from a top view perspective, vias 119 of the first metal interconnect M₁ in the first region 700a have a foot print of, for example, two circles 50a. However, the foot print of the vias 119 of the first metal interconnect M₁ in the first region 700a may not be limited thereto. Other geometrical shapes are within the contemplated scope of the present disclosure. On the surface of the dielectric layer 206b, the MTJ layer 201a in the first region 700a has a foot print of, for example, a circle 51a. A bottom of the MTJ layer 201a may possess a diameter D1, and a top of the MTJ layer 201a may possess a diameter D2 shown in dotted lines. In some embodiments, the diameter D1 of the MTJ layer 201a is in a range of from about 10 nm to about 60 nm. In some embodiments, the diameter D2 of the MTJ layer 201a is smaller than the diameter D1 by 20% to 50%.

In FIG. 10, from a top view perspective, vias 119 of the first metal interconnect M₁ in the second region 700b have a foot print of, for example, two circles 50b. However, the foot print of the vias 119 of the first metal interconnect M₁ in the second region 700b may not be limited thereto. Other geometrical shapes are within the contemplated scope of the present disclosure. On the surface of the dielectric layer 206b, the MTJ layer 201b in the second region 700b has a foot print of, for example, a circle 51b. A bottom of the MTJ layer 201b may possess a diameter D1', and a top of the MTJ layer 201b may possess a diameter D2' shown in dotted lines. Note the diameter D1' is smaller than the diameter D1, and similarly, the diameter D2' is smaller than the diameter D2. In some embodiments, memory in the first region 700a is a Flash, and the memory in the second region 700b is an SRAM.

In some embodiments, the diameter Dr of the MTJ layer 201b is in a range of from about 10 nm to about 60 nm. Note the diameter D1' is smaller than the diameter D1, and similarly, the diameter D2' is smaller than the diameter D2. In some embodiments, the diameter D2' of the MTJ layer 201a is smaller than the diameter D1' by 20% to 50%.

Figure 11:
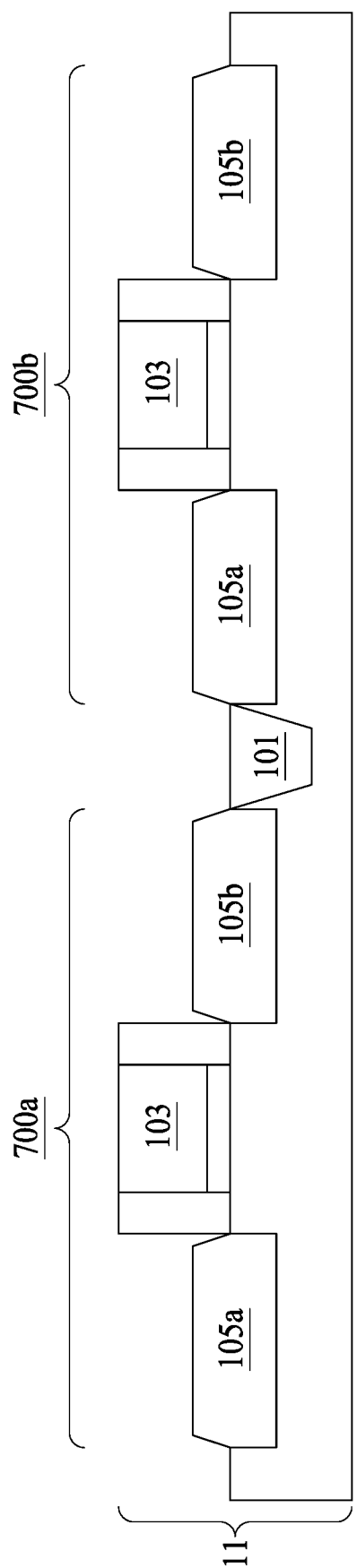
FIG. 11 to FIG. 26 show fragmental cross sectional views of the formation of a semiconductor structure integrated with an MTJ in a first region and a second region, according to some embodiments of the present disclosure.

FIG. 11 to FIG. 26 show fragmental cross sectional views of the formation of a semiconductor structure integrated with an MTJ in a first region 700a and a second region 700b, according to some embodiments of the present disclosure. In FIG. 11, two transistor regions in a form of transistors are formed over the substrate 100. As shown in FIG. 11, each transistor includes a gate 103 and doped regions 105a, 105b. The transistor in the first region 700a and the second region 700b are isolated by an STI 101. In some embodiments, the doped regions 105a, 105b are raised source and drain, and the gate 103 is a metal gate.

Figure 12:
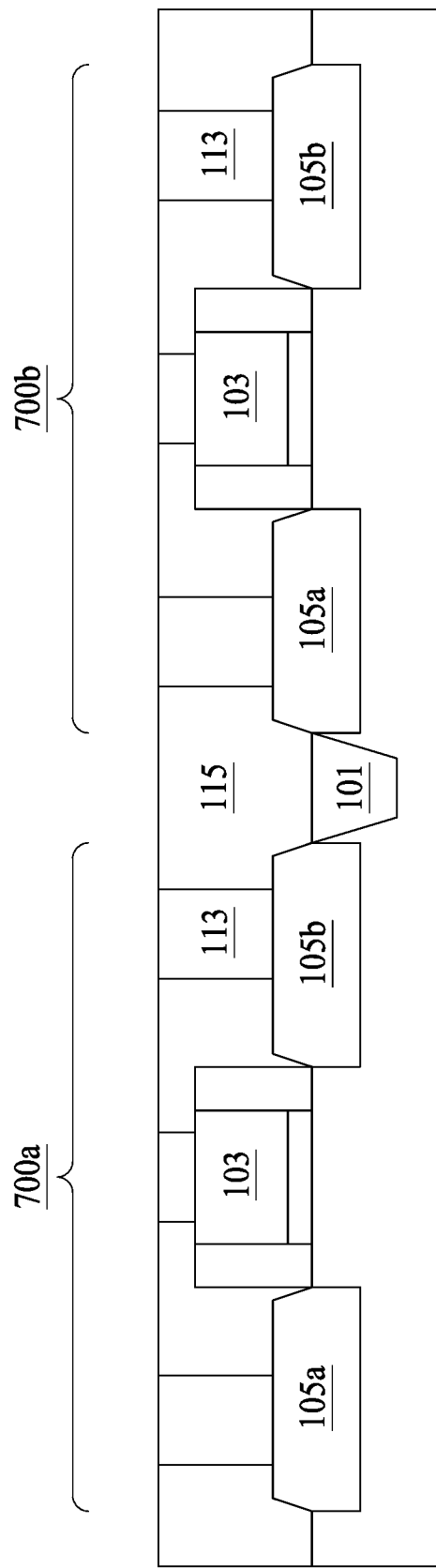

In FIG. 12, conductive plugs 113 are formed extending from the doped regions 105a, 105b and the gate 103. A patterned ILD 115 is formed before the filling of the contact plugs 113. For example, through holes formed in the ILD 115 and subsequently being filled with electrically conductive material, e.g. copper, gold or another suitable metal or alloy, to form a number of conductive plugs 113. The conductive plugs 113 may be electrically connected to semiconductor devices such as transistors in the semiconductor substrate 100. The conductive plugs 113 may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In FIG. 12, a planarization operation is performed to expose a top surface of the conductive plugs 113 and the top surface of the ILD 115.

Figure 13:
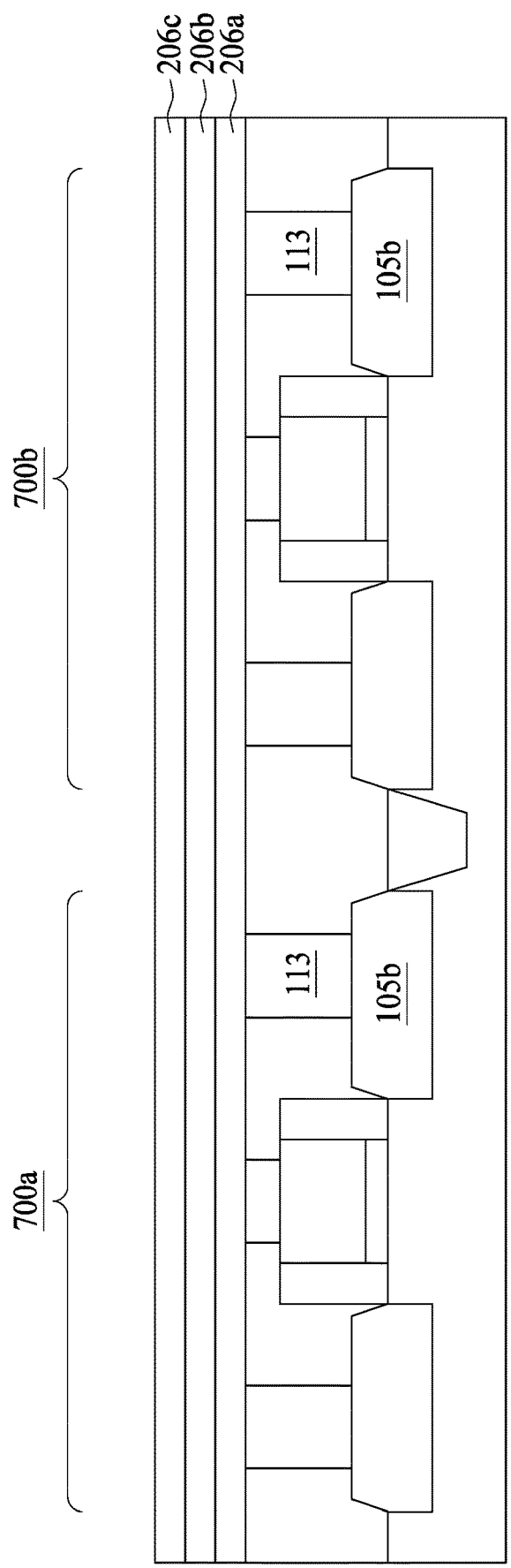

In FIG. 13, a stack of dielectric layers 206a, 206b, 206c are formed over the planarized surface described in FIG. 12. In some embodiments, the dielectric layers 206a, 206c can be of identical materials, whereas the dielectric layer 206b can be another material having a different selectivity in term of an etching or a CMP operation. For example, the dielectric layer 206b can be a silicon oxide layer, whereas the dielectric layers 206a, 206c can other dielectric other than silicon oxide. The stack of dielectric layers 206a, 206b, 206c can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Figure 14:
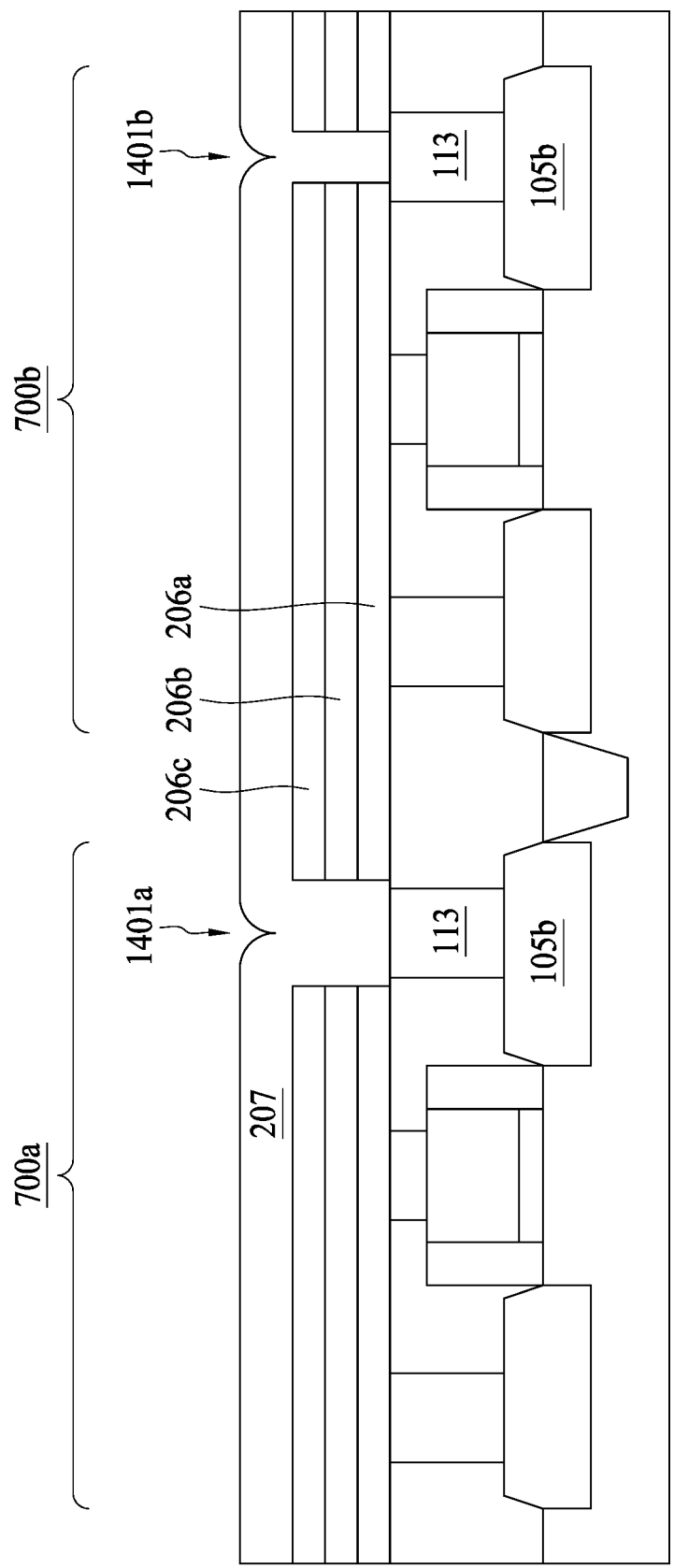
Figure 15:
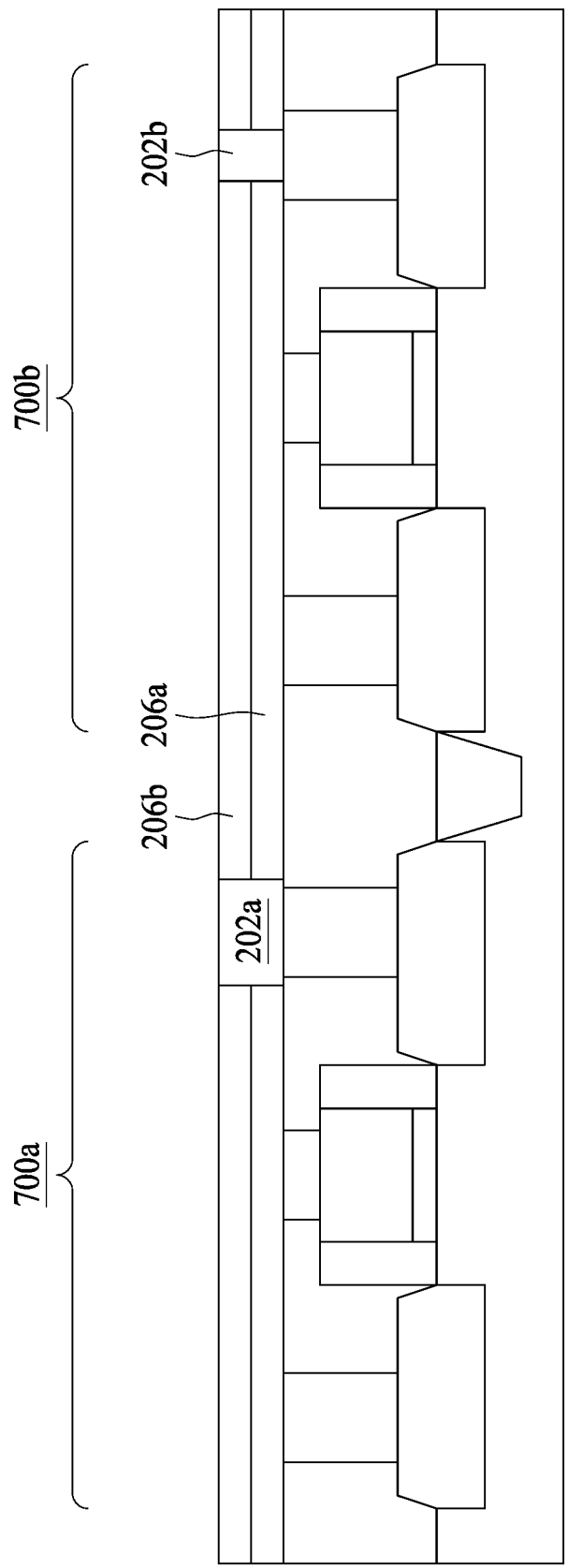

In FIG. 14 and FIG. 15, two openings 1401a, 1401b are formed penetrating through the stack of dielectric layers 206a, 206b, and 206c. As demonstrated in FIG. 14, a first opening 1401a is formed over a contact plug 113 electrically coupled to the doped region 105b of the first region 700a. A second opening 1401b is formed over a contact plug 113 electrically coupled to the doped region 105b of the second region 700b. In some embodiments, a width of the first opening 1401a is greater than a width of the second opening 1401b. Subsequently, a conductive layer 207 is formed over the stack of dielectric layers 206a, 206b, and 206c as well as filling the first opening 1401a and the second opening 1401b. The conductive layer 207 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In FIG. 15, a planarization operation is performed to remove the overburden of the conductive materials 207 and the dielectric layer 206c. A lower electrode 202a in the first region 700a and a lower electrode 202b in the second region 700b can be obtained at the completion of the planarization operation. Note the lower electrode 202a has a surface area different from a surface area of the lower electrode 202b viewing from a top view perspective (not shown). The difference in surface areas between the lower electrodes 202a and 202b is due to the formation of subsequent MTJ layers having different dimensions.

Figure 16:
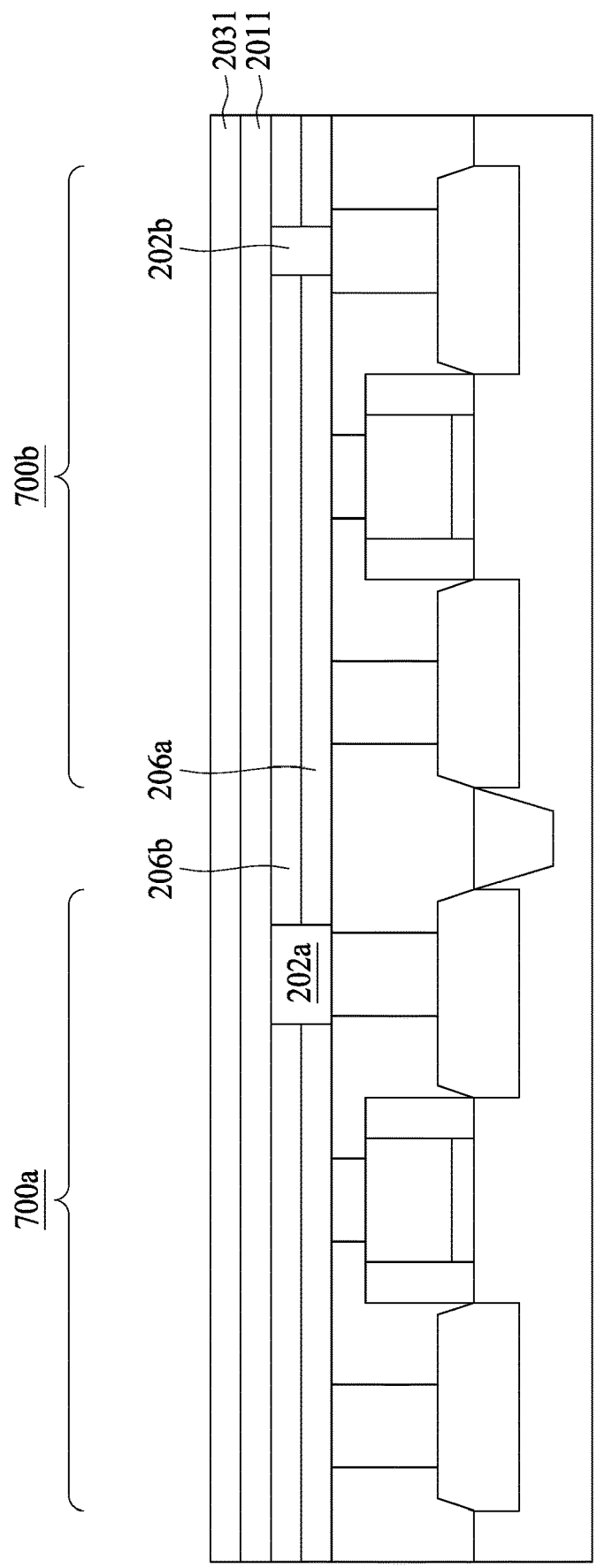

In FIG. 16, an MTJ layer 2011 having a thickness of from about 150 Å to about 250 Å and a conductive layer 2031 are formed over the planarized surface shown in FIG. 15. The MTJ layer 2011 is formed on the lower electrodes 202a, 202b and patterned dielectric stacks 206a, 206b. The MTJ layer 2011 may be formed by variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the MTJ layer 2011 is a stack of various deposited films. Detailed structure of the MTJ layer 2011 is previously described in FIG. 5 and FIG. 6, and is not repeated here for simplicity. The conductive layer 2031 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Figure 17:
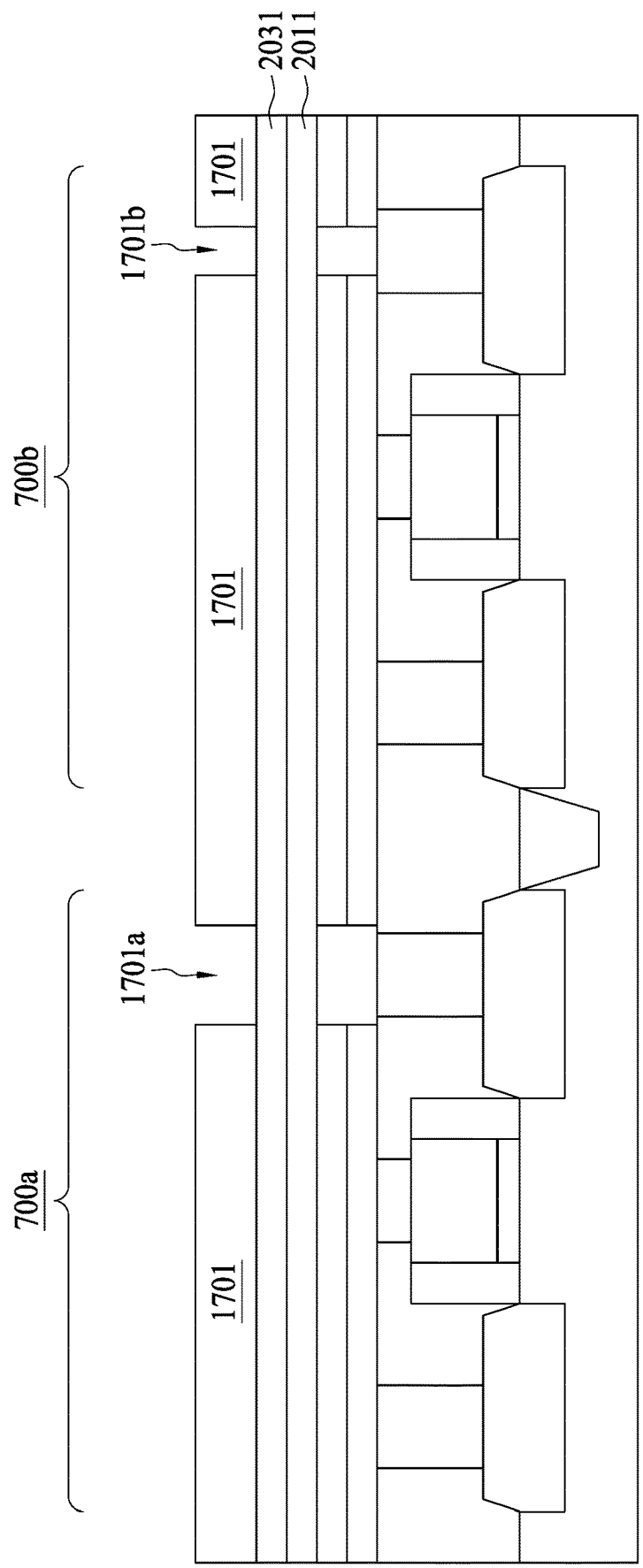
Figure 18:
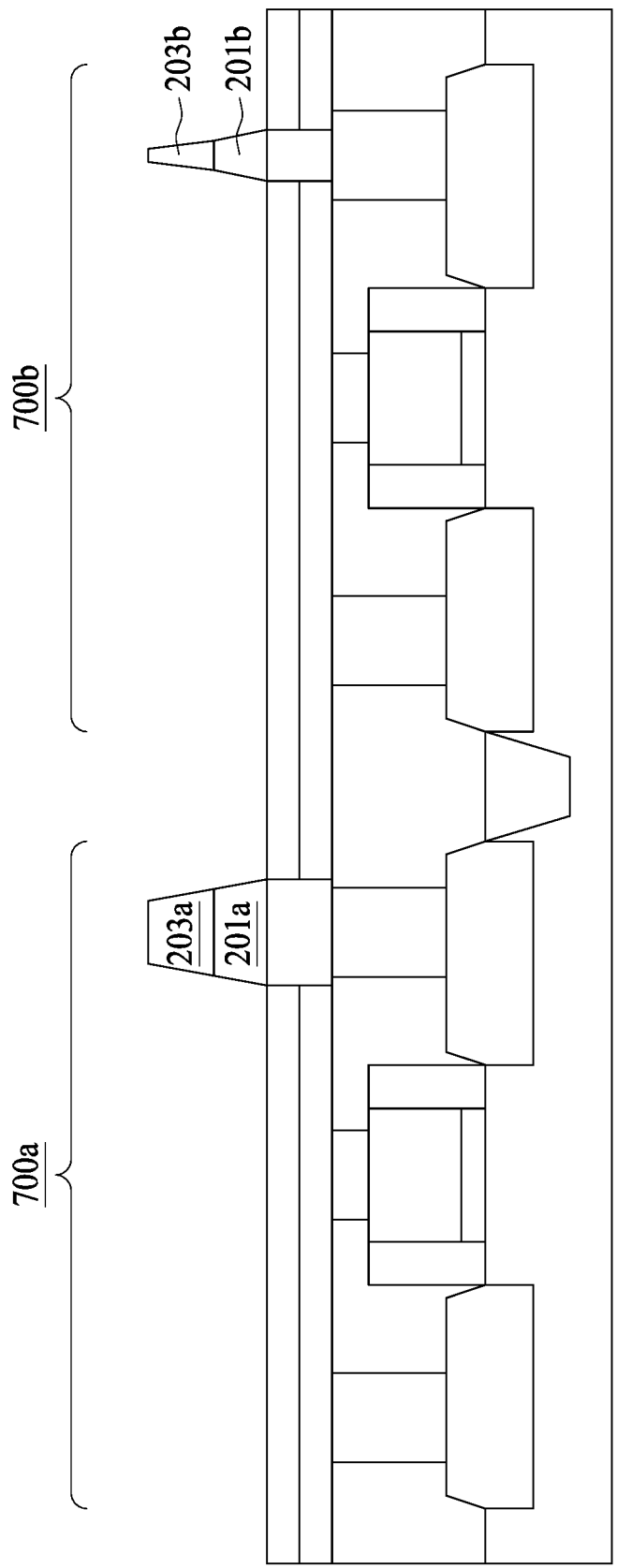

In FIG. 17, a mask layer 1701 is formed on the conductive layer 2031. The mask layer 1701 may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the mask 1701 is configured to pattern the MTJ layers 201a, 201b and upper electrodes 203a, 203b shown in FIG. 18. For example, a width of the openings 1701a, 1701b of the mask layer 1701 are determined according to the desired MTJ diameter. As previously discussed, the first MTJ layer 201a in the first region 700a possesses a bottom diameter D1 of from about 10 nm to about 60 nm from a top view perspective, and the second MTJ layer 201b in the second region 700b possesses a bottom diameter Dr smaller than that of D1. In some embodiments, the MTJ layers 201a, 201b and the upper electrodes 203a, 203b are formed to have a trapezoidal shape viewing from the cross section.

Figure 19:
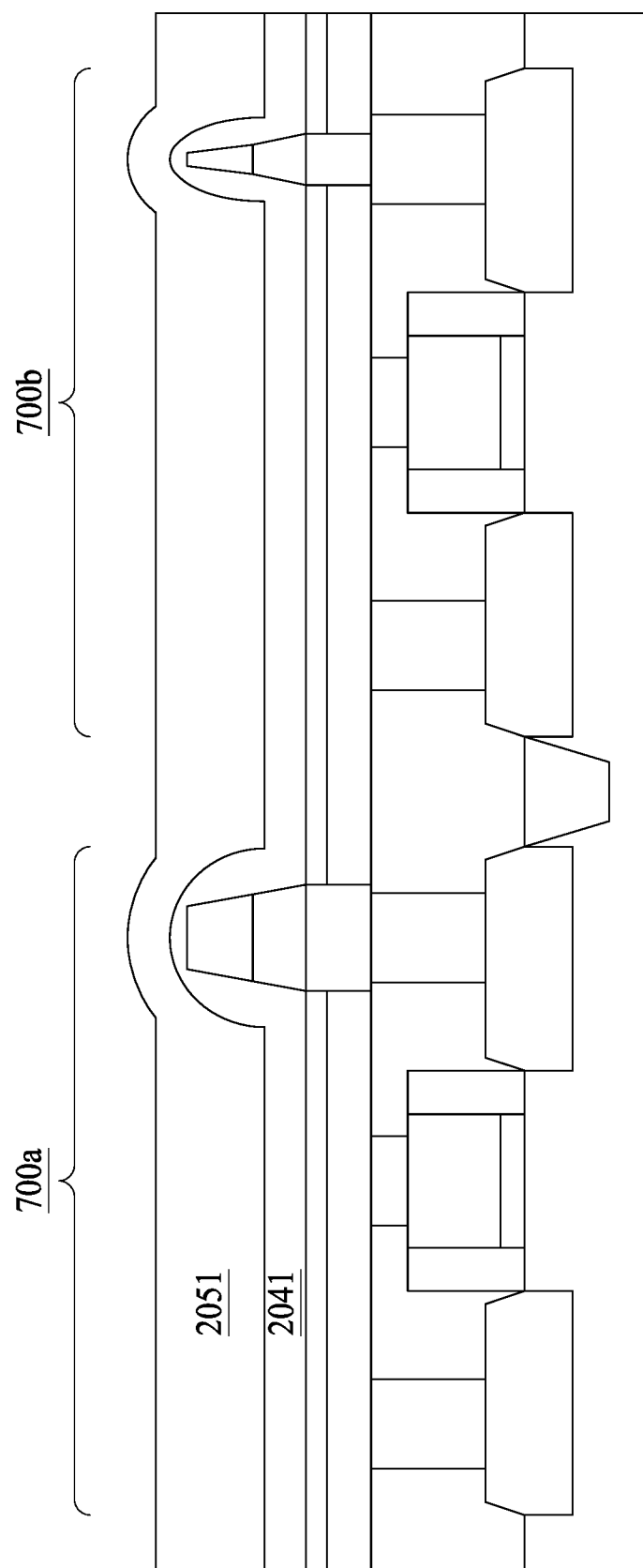
Figure 20:
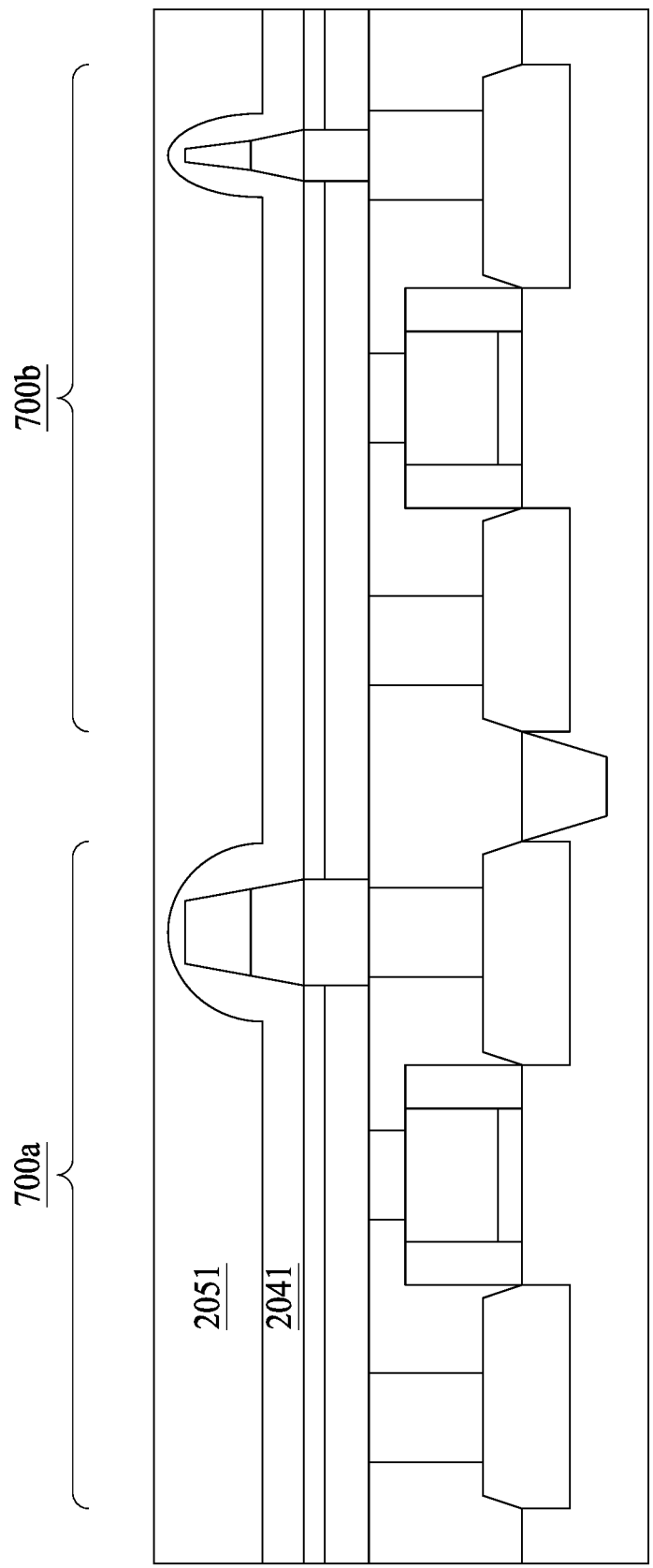

In FIG. 19, a dielectric layer 2041 is conformally formed over the MTJ layers 201a, 201b and the upper electrodes 203a, 203b. In some embodiments, the dielectric layer 2041 possesses a thickness of from about 50 Å to about 300 Å. Note a sidewall of the MTJ layers 201a, 201b and the sidewall of lower electrode 202a, 202b are surrounded by the dielectric layer 2041 to prevent oxidation or other contamination. Subsequently, a dielectric layer 2051 such as an oxide layer is conformally deposited over the dielectric layer 2041. In FIG. 20, a planarization operation is performed on the dielectric layer 2051 such that a top surface of the dielectric layer 2051 is substantially flat. This planarization operation is a preparation step for the following thinning operation where starting with a substantially flat surface is crucial to said thinning operation. As shown in FIG. 20, a top surface of the MTJ layer 203a, 203b is not exposed from the dielectric layer 2041 after the planarization operation.

Figure 21:
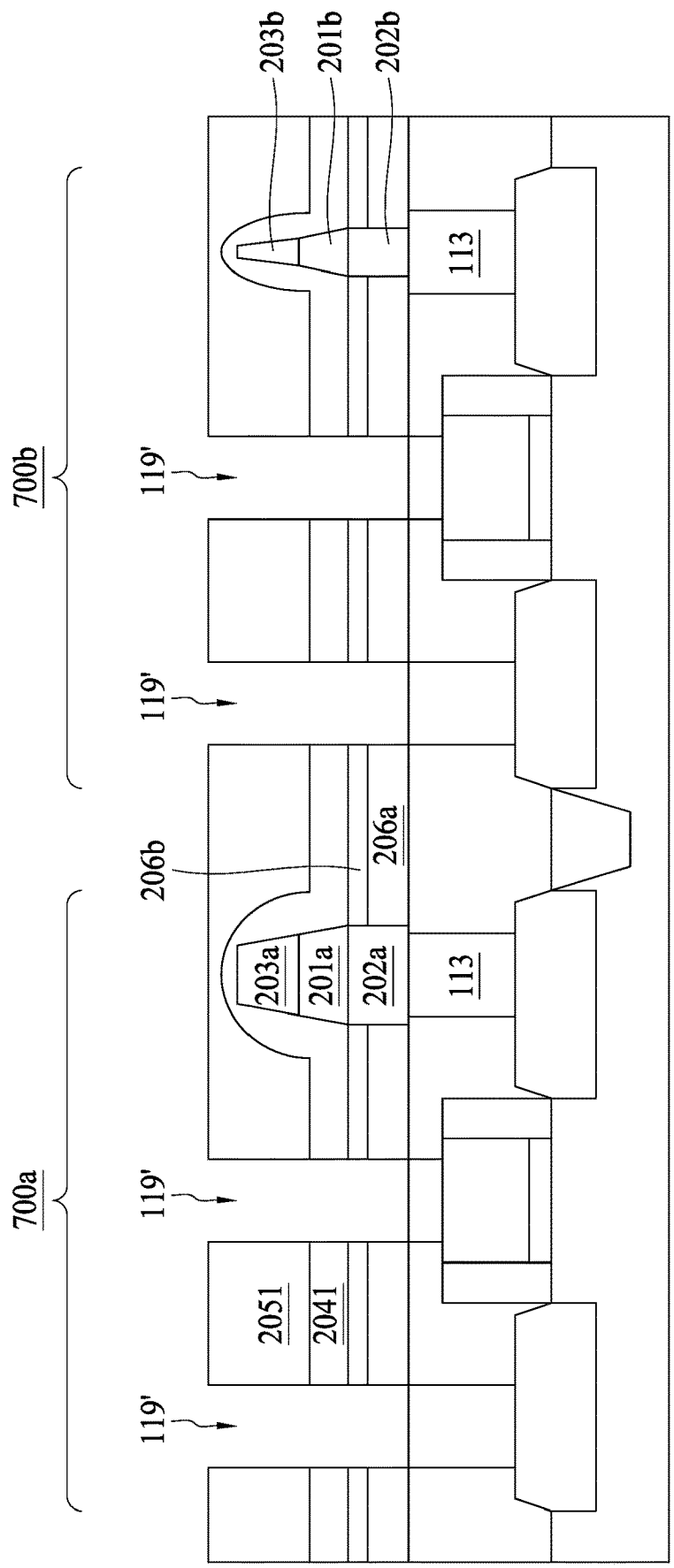
Figure 22:
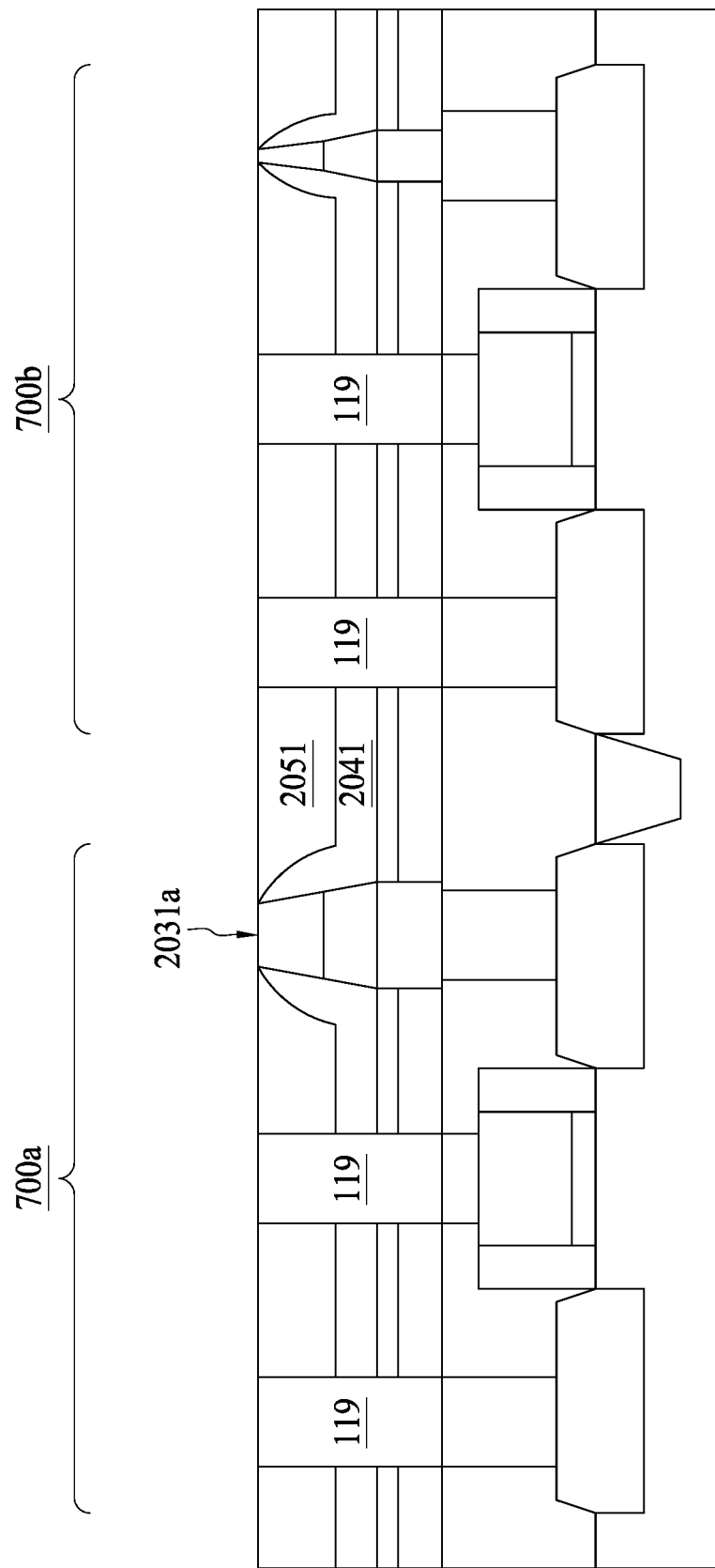

Referring to FIG. 21 and FIG. 22, the vias 119 are formed over the conductive plugs 113. In some embodiments, multiple openings 119' are patterned through the dielectric layers 2051, 2041, 206b, and 206a until the conductive plug is exposed. Subsequently, conductive material is filled into the openings 119', followed by a thinning operation removing the overburden of the conductive material and a portion of the dielectric layers 2051, 2041. Noted in FIG. 22 a top surface 2031a of the MTJ layer 203a is exposed as a result of the thinning operation.

Figure 23:
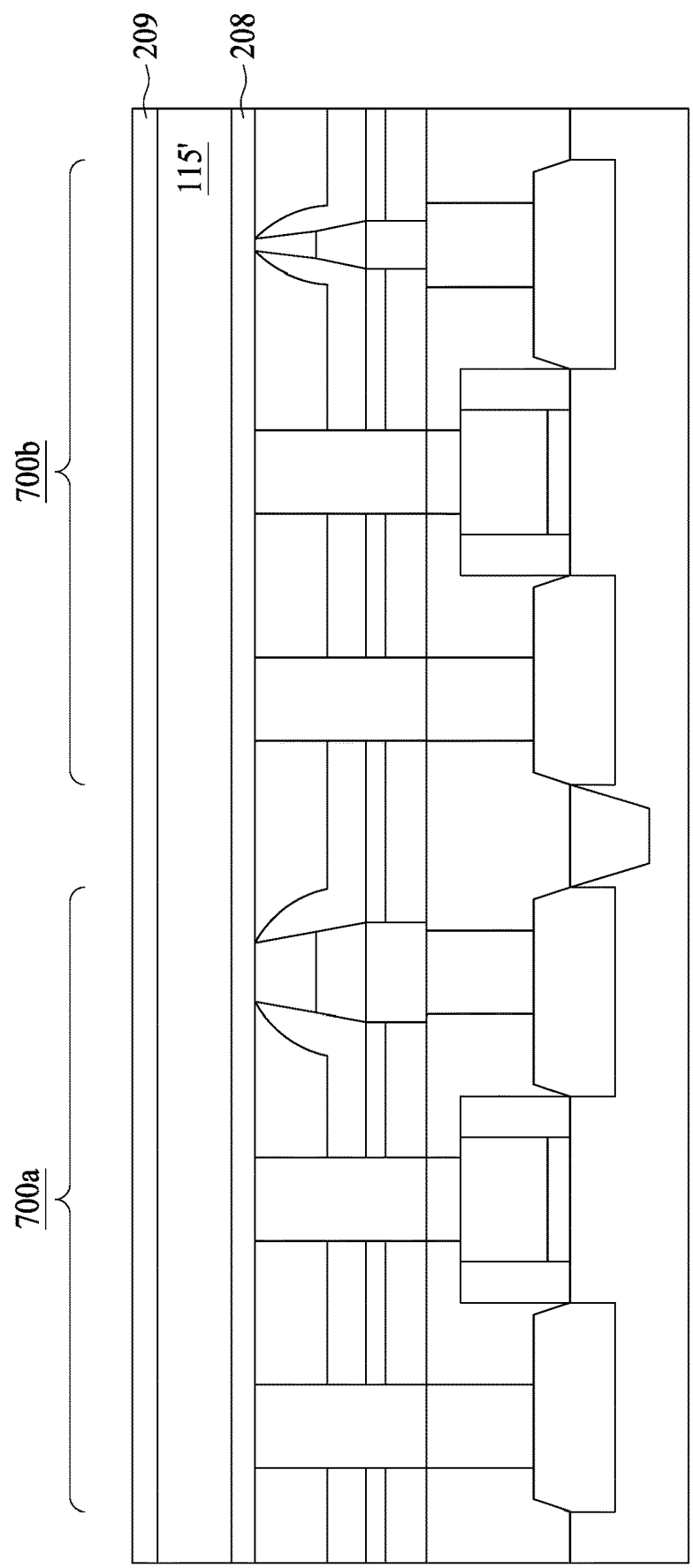
Figure 24:
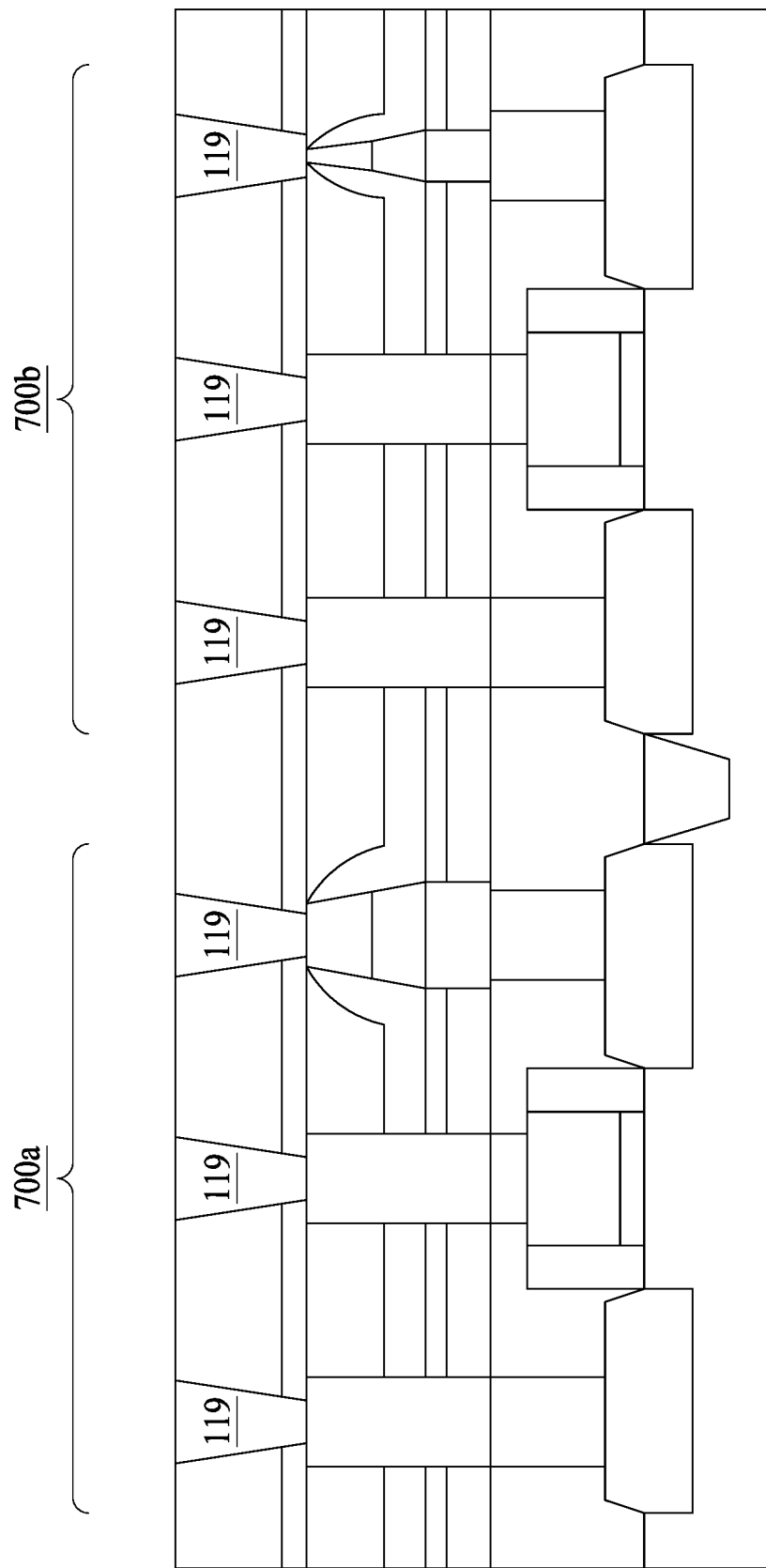
Figure 25:
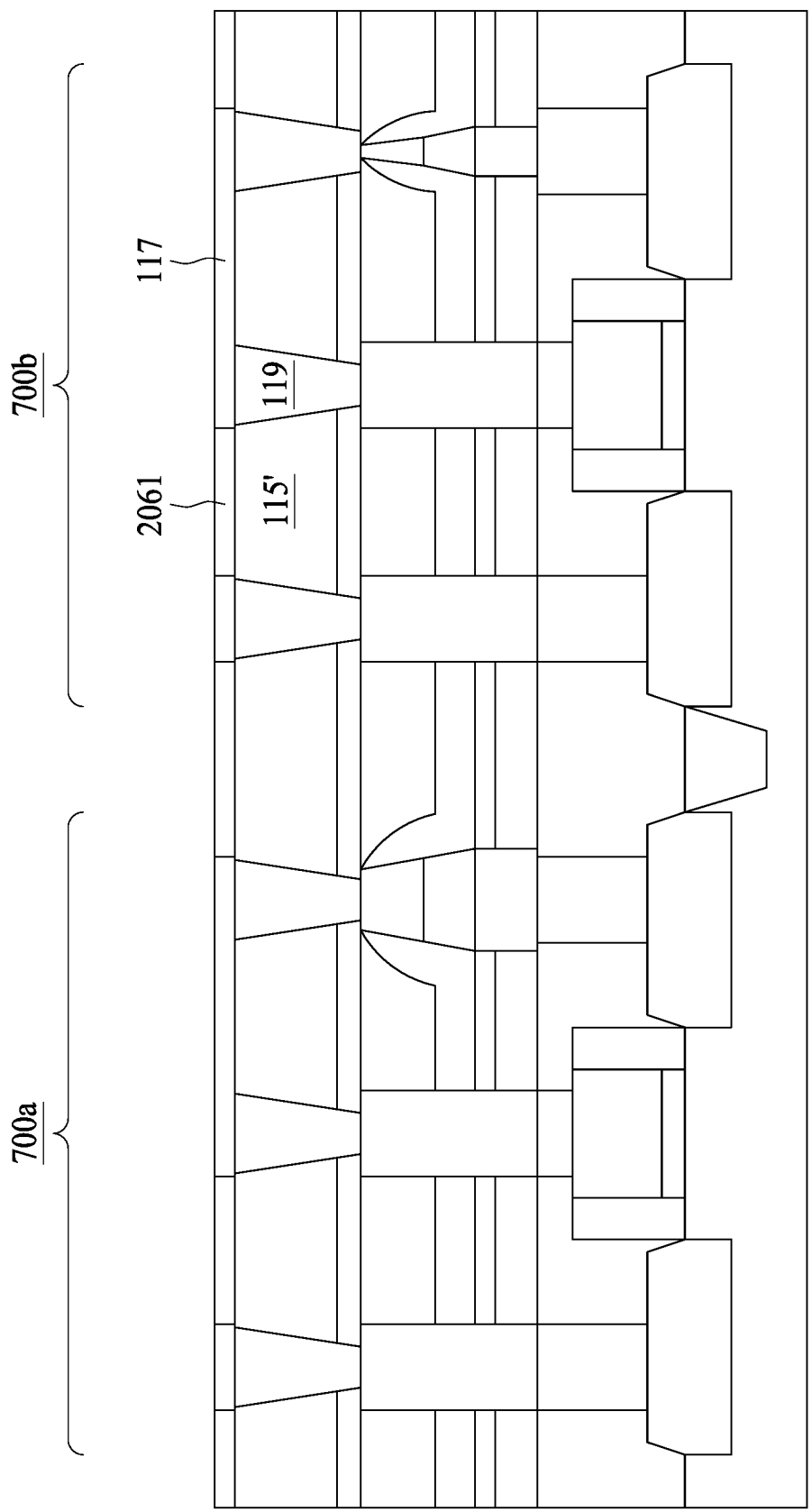

Referring to FIG. 23, FIG. 24, and FIG. 25, a first metal interconnect $M_1$ including vias 119 and metal lines 117 connecting vias 119 are formed over the vias 119 at the same level with the MRAM cell. In FIG. 23, an etch stop layer (ESL) 208, an IMD 115' and a masking layer 209 are blanket deposited over the planarized surface in FIG. 22. The IMD 115', the ESL, and the masking layer 209 can be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. Trenches to be filled with conductive materials are patterned over the vias 119 at the same level with the MRAM cell. In FIG. 24, conductive materials are filled into the trenches. After another planarization operation, a dielectric layer 2061 is formed over the filled trenches and metal lines 117 are formed using, for example, Damascene operation.

Figure 26:
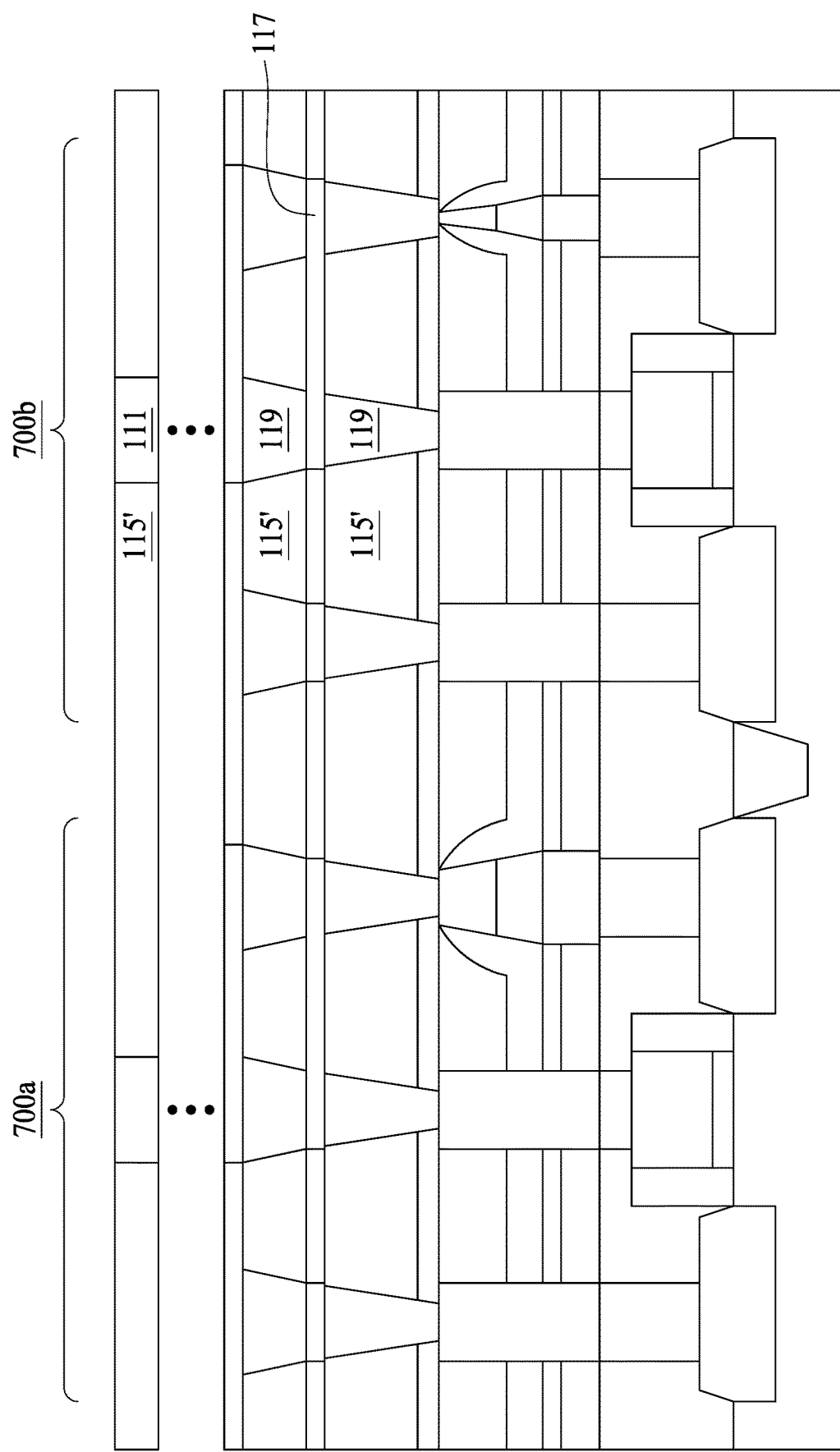

In FIG. 26, upper metal layer such as $M_3$, $M_4$ ... $M_{top}$ are formed over the first metal interconnect $M_1$ and construct the interconnect structure over the MRAM cell.

The integrated circuit device may undergo further CMOS or MOS technology processing to form various features known in the art. For example, one or more contact features (not shown), such as silicide regions, may also be formed. The contact features may be coupled to the source and drain. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) process.

Subsequent processing may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

The present disclosure provides a semiconductor structure including a substrate, a transistor region having a gate over the substrate and a doped region at least partially in the substrate, a first metal interconnect over the transistor region, and a magnetic tunneling junction (MTJ) between the transistor region and the first metal interconnect. A first region over the substrate including a first magnetic tunneling junction (MTJ) between the transistor region and the first metal interconnect, and a second region over the substrate not overlapping with the first region.

The present disclosure provides a semiconductor structure including a substrate, a transistor region having a gate over the substrate and a doped region at least partially in the substrate, and a first metal interconnect over the transistor region.

The present disclosure provides a method for manufacturing a semiconductor structure, including forming a transistor region over a substrate, the transistor region comprising a gate and a doped region, forming a magnetic tunneling junction (MTJ) over the transistor region, electrically coupling to the transistor region, and forming a first metal interconnect over the MTJ, electrically coupling to the MTJ and the transistor region.

Although the present invention and its advantages have been described in detail, it should be understood that various changes, substitutions and alterations cancan be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor structure, comprising:
   forming a transistor region over a substrate, the transistor region comprising a gate and a first doped region;
   forming a magnetic tunneling junction (MTJ) directly over the first doped region, electrically coupling to the transistor region; and
   forming a metal via directly over the gate after forming the MTJ, the metal via being at a same level with the MTJ, forming the metal via comprising:
      filling conductive material in an opening of a dielectric layer surrounding the MTJ; and
      removing a portion of the conductive material and subsequently removing a portion of the dielectric layer until a top surface of the MTJ is exposed.

2. The method of claim 1, wherein the forming the transistor region comprises forming a transistor having the gate and the first doped region and forming a conductive plug structure extending from the doped region.

3. The method of claim 2, further comprising forming a lower electrode and an upper electrode of the MTJ, the lower electrode being electrically coupling to the first doped region through the conductive plug structure.

4. The method of claim 3, wherein the forming the MTJ over the transistor region comprises patterning the MTJ with a diameter of from about 10 nm to about 60 nm at a bottom surface of the MTJ from a top view perspective.

5. The method of claim 3, further comprising forming the dielectric layer conformally covering the upper electrode and a sidewall of the MTJ.

6. The method of claim 1, further comprising forming a first metal interconnect over the MTJ and the metal via, electrically coupling to the MTJ and the transistor region.

7. A method for manufacturing a semiconductor structure, comprising:
   forming a transistor region over a substrate, the transistor region comprising a gate and a first doped region;
   forming a first contact plug directly over the gate and a second contact plug directly over the first doped region;
   forming a magnetic tunneling junction (MTJ) directly over the first doped region, electrically coupling to the transistor region; and
   forming a first metal interconnect directly over the gate after forming the MTJ, the first metal interconnect being at a same level with the MTJ, forming the first metal interconnect comprising:
      forming a dielectric layer conformally covering an upper electrode and a sidewall of the MTJ
      filling conductive material in an opening of the dielectric layer; and
      removing a portion of the conductive material and subsequently removing a portion of the dielectric layer until a top surface of the MTJ is exposed.

8. The method of claim 7, further comprising:
   forming an etch stop layer over the top surface of the MTJ after exposing the top surface of the MTJ by removing the dielectric layer.

9. The method of claim 7, wherein forming the MTJ comprises forming an upper electrode in contact with a metal via over the first metal interconnect.

10. The method of claim 7, wherein forming the MTJ comprises forming a bottom electrode in contact with the second contact plug.

11. The method of claim 7, wherein the first contact plug and the first metal interconnect are composed of different materials.

12. The method of claim 7, wherein forming the dielectric layer conformally covering an upper electrode and a sidewall of the MTJ comprises:
   conformally forming a first dielectric layer over the MTJ;
   forming a second dielectric layer over the MTJ; and
   planarize a top surface of the second dielectric layer.

13. The method of claim 12, wherein filling conductive material in the opening of the dielectric layer further comprises:
   removing a portion of the first dielectric layer and a portion of the second dielectric layer until the first contact plug is exposed.

14. The method of claim 12, wherein removing the portion of the conductive material further comprises:
   removing an overburden of the conductive material on the top surface of the second dielectric layer.

15. The method of claim 7, father comprising simultaneously forming metal vias over the top surface of the MTJ and a top surface of the first metal interconnect.

16. The method of claim 7, wherein the MTJ comprises a diameter of from about 10 nm to about 60 nm from a top view perspective at a bottom surface of the MTJ.

17. A method for manufacturing a semiconductor structure, comprising:
   forming a first transistor region and a second transistor region over a substrate, the first transistor region comprising a first gate and a first doped region, the second transistor region comprising a second gate and a second doped region;

simultaneously forming a first magnetic tunneling junction (MTJ) directly over the first doped region and a second MTJ directly over the second doped region, wherein a diameter at a bottom of the first MTJ is different from a diameter at a bottom of the second MTJ from a top perspective; and forming an interconnect directly over the first gate and the second gate after forming the first MTJ and the second MTJ, the interconnect being at a same level with the first MTJ and the second MTJ, forming the interconnect comprising:

forming a dielectric layer conformally covering an upper electrode and a sidewall of each of the first MTJ and the second MTJ;

filling conductive material in openings of the dielectric layer; and removing a portion of the conductive material and subsequently removing a portion of the dielectric layer until a top surface of the first MTJ and a top surface of the second MTJ are exposed.

18. The method of claim 17, wherein a height of the first MTJ is different from a height of the second MTJ from a cross sectional perspective.

19. The method of claim 17, further comprising forming a first contact plug over the first doped region and a second contact plug over the second doped region prior to forming the first MTJ and the second MTJ.

20. The method of claim 17, wherein removing the portion of the conductive material comprises removing an overburden of the conductive material on a top surface of the dielectric layer.

* * * * *